(12) United States Patent
Togashi

(10) Patent No.: US 12,289,847 B2
(45) Date of Patent: Apr. 29, 2025

(54) DISPLAY DEVICE INCLUDING A FOLDABLE HOUSING UNIT AND A FLEXIBLE DISPLAY PANEL

(71) Applicant: SHARP KABUSHIKI KAISHA, Sakai (JP)

(72) Inventor: Yasuyuki Togashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 433 days.

(21) Appl. No.: 17/612,355

(22) PCT Filed: May 28, 2019

(86) PCT No.: PCT/JP2019/021153
§ 371 (c)(1),
(2) Date: Nov. 18, 2021

(87) PCT Pub. No.: WO2020/240712
PCT Pub. Date: Dec. 3, 2020

(65) Prior Publication Data
US 2022/0248549 A1      Aug. 4, 2022

(51) Int. Cl.
| | | |
|---|---|---|
| H05K 5/02 | (2006.01) | |
| F16C 11/04 | (2006.01) | |
| G06F 1/16 | (2006.01) | |
| G06F 3/041 | (2006.01) | |
| H05K 5/00 | (2006.01) | |

(52) U.S. Cl.
CPC ............ *H05K 5/0226* (2013.01); *F16C 11/04* (2013.01); *G06F 1/1616* (2013.01); *G06F 1/1652* (2013.01); *G06F 1/1681* (2013.01); *G06F 3/041* (2013.01); *H05K 5/0017* (2013.01)

(58) Field of Classification Search
CPC .... G06F 1/1681; G06F 1/1652; G06F 1/1616; H04M 1/0268; G09F 9/301
See application file for complete search history.

(56) References Cited

U.S. PATENT DOCUMENTS

| | | | |
|---|---|---|---|
| 8,804,317 B2* | 8/2014 | Watanabe | G09F 9/301 |
| | | | 361/755 |
| 9,588,549 B2* | 3/2017 | Endo | G06F 1/1643 |
| 10,365,691 B2* | 7/2019 | Bae | G06F 1/1652 |
| 10,423,019 B1* | 9/2019 | Song | G06F 1/1641 |
| 10,440,840 B2* | 10/2019 | Ochi | H04M 1/022 |
| 10,520,992 B1* | 12/2019 | Chang | H05K 5/0226 |
| 11,023,009 B2* | 6/2021 | Kim | G06F 1/1681 |
| 11,602,058 B2* | 3/2023 | Kim | G06F 1/1626 |
| 12,111,693 B2* | 10/2024 | Nishioka | G06F 1/1652 |

(Continued)

FOREIGN PATENT DOCUMENTS

JP       2016-015618 A       1/2016

*Primary Examiner* — Rockshana D Chowdhury
*Assistant Examiner* — Douglas R Burtner
(74) *Attorney, Agent, or Firm* — ScienBiziP, P.C.

(57) ABSTRACT

A housing unit of a display device includes a first shaft rotatably connecting an end portion of a first housing to a hinge member, a second shaft rotatably connecting an end portion of a second housing to the hinge member, and a third shaft rotatably connecting a first end portion of first and second cover holder members to the hinge member, and a second end portion of the first and second cover holder members is slidably connected to the first and second housings, respectively.

19 Claims, 24 Drawing Sheets

(56) References Cited

U.S. PATENT DOCUMENTS

| | | | |
|---|---|---|---|
| 2010/0075717 A1* | 3/2010 | Ou | H04M 1/0216 |
| | | | 455/566 |
| 2012/0113614 A1* | 5/2012 | Watanabe | G02F 1/13336 |
| | | | 361/810 |
| 2015/0261259 A1* | 9/2015 | Endo | H10K 59/12 |
| | | | 361/679.06 |
| 2015/0378397 A1* | 12/2015 | Park | G06F 1/1656 |
| | | | 361/679.27 |
| 2016/0007441 A1* | 1/2016 | Matsueda | G09F 9/301 |
| | | | 361/749 |
| 2017/0222177 A1 | 8/2017 | Matsueda | |
| 2017/0328102 A1* | 11/2017 | Kato | E05D 11/1078 |
| 2018/0159069 A1 | 6/2018 | Matsueda | |
| 2019/0343010 A1* | 11/2019 | Ji | H10K 59/873 |
| 2020/0363843 A1* | 11/2020 | Cheng | H04M 1/02 |

\* cited by examiner

DISPLAY DEVICE INCLUDING A FOLDABLE HOUSING UNIT AND A FLEXIBLE DISPLAY PANEL

TECHNICAL FIELD

The disclosure relates to a display device including a foldable housing unit and a flexible display panel.

BACKGROUND ART

In recent years, as foldable display devices, display devices have been proposed each of which ensures the curvature of a display panel when the display device is folded by configuring the display panel of a folded portion unfixed and providing a space section that allows the display panel of the folded portion to curve and enter when the display device is being folded.

As an example of such a display device, PTL 1 discloses a display device including a housing unit that includes first and second receiving portions rotatably connected to first and second support members with a hinge, first and second rotary levers that move the first and second receiving portions, and a movable support member that rotatably supports the first and second rotary levers. The display device supports the display panel with the movable support member, the first and second receiving portions, and the first and second support members when the housing unit is deployed, while forming, when the housing unit is being folded, a space section for receiving the display panel of a folded portion to bent with the movable support member, the first and second receiving portions, and the first and second rotary levers.

PTL 2 discloses a display device including a housing unit that includes a first housing composed of a plurality of plate-shaped housings connected by a plurality of hinge portions and forming a space for storing a folded portion of a display panel when the housing unit is folded, a plate-shaped second housing and third housing that are connected foldable in opposite directions to each other at both ends of the first housing, and a sliding retention member that fixes the second housing and the third housing when the housing unit is deployed and supports the folded portion of the display panel.

CITATION LIST

Patent Literature

PTL 1: US 2015/0378397 A
PTL 2: JP 2016-015618 A

SUMMARY

Technical Problem

However, in the display device disclosed in PTL 1, while the first and second receiving portions are moved by the first and second rotary levers so as to support the display panel by the movable support member, the first and second receiving portions, and the first and second support members when the display device is deployed, a gap (step) is created between the first and second receiving portions and the movable support member since the first and second receiving portions only rotate about the hinge. Since the foldable display panel is soft, pressing a portion of the gap causes a recess, and a touch panel cannot be used on the portion.

In the display device disclosed in PTL 2, the display panel is prevented from being recessed by using a sliding retention member. However, the mechanism becomes complex in attempting to slide the sliding retention member in conjunction with the opening/closing operation, and the first housing connected by the plurality of hinge portions has a protruding shape when the housing unit is deployed.

An aspect of the disclosure has been made in view of the above-mentioned problem, and has an object to provide a display device in which a display surface of a display panel in a display region is covered by a cover member when being deployed.

Solution to Problem

A display device according to an aspect of the disclosure includes: a housing unit being foldable; and a display panel with flexibility, wherein the display panel includes a first display region, and a second display region adjacent to the first display region, the housing unit includes a hinge member, a first housing and a second housing connected to each other via the hinge member, a first cover holder member and a second cover holder member connected to each other and connected to the hinge member, a first cover member held by the first cover holder member, and covering a display surface of the display panel in the first display region, a second cover member held by the second cover holder member, and covering a display surface of the display panel in the second display region, a first fulcrum connecting the hinge member and an end portion of the first housing in a manner of being relatively rotatable between the hinge member and the first housing, a second fulcrum connecting the hinge member and an end portion of the second housing in a manner of being relatively rotatable between the hinge member and the second housing, and a third fulcrum connecting the hinge member, a first end portion of the first cover holder member, and a first end portion of the second cover holder member in a manner of being relatively rotatable between the hinge member, the first cover holder member, and the second cover holder member, a second end portion on an opposite side to the first end portion of the first cover holder member is slidably connected to the first housing, and a second end portion on an opposite side to the first end portion of the second cover holder member is slidably connected to the second housing.

Advantageous Effects of Invention

The display device according to an aspect of the disclosure can provide a display device in which a display surface of a display panel in a display region is covered by a cover member when being deployed.

Figure 9:
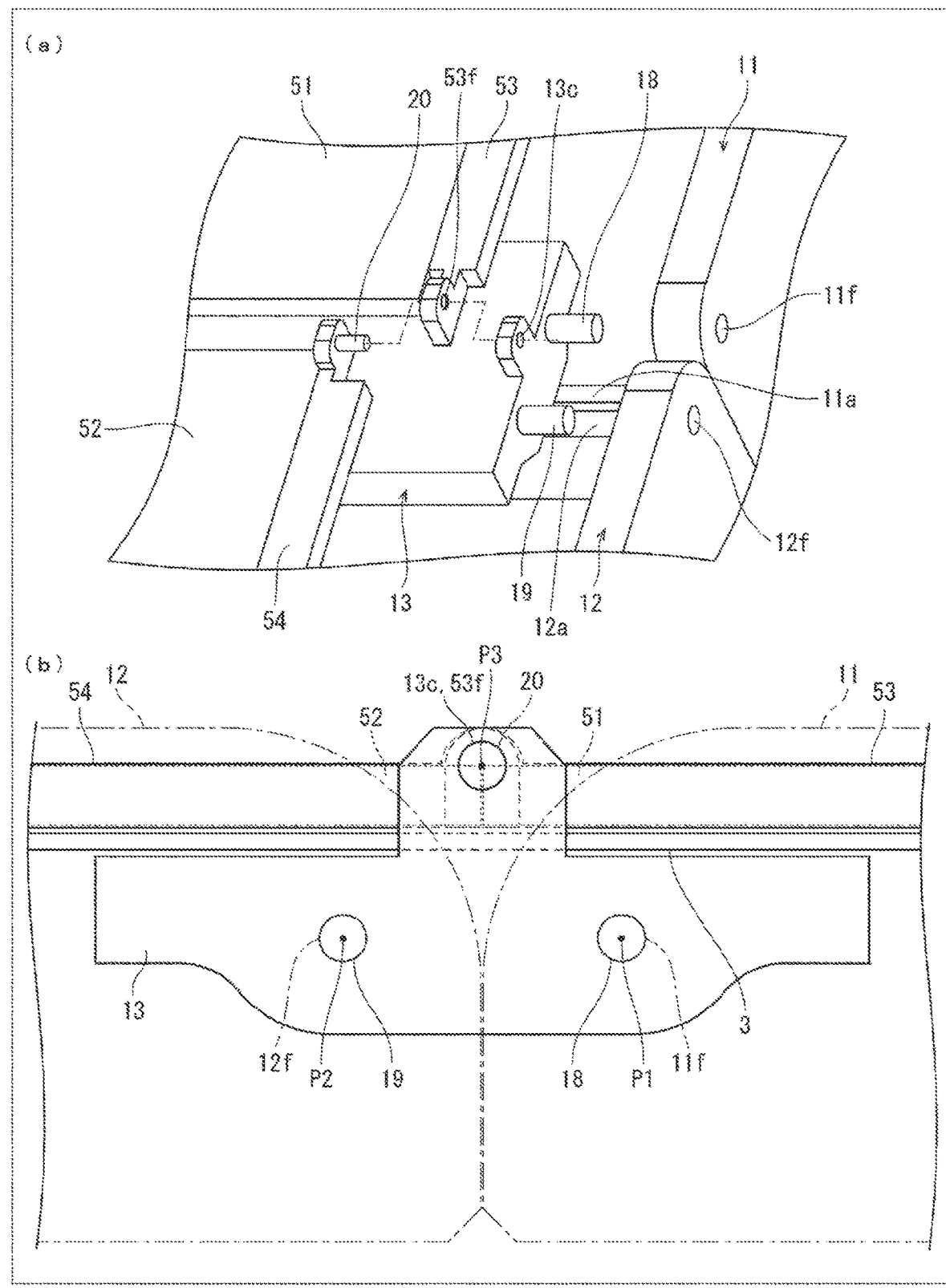

(a) of FIG. 9 is an enlarged exploded view of main portions illustrating a relationship among a hinge member, a first cover holder member, a second cover holder member, a first housing, and a second housing, and (b) of FIG. 9 is an enlarged view of main portions illustrating a relationship of the hinge member, the cover holder member, and the cover glass with respect to a display panel through the housing.

Figure 10:
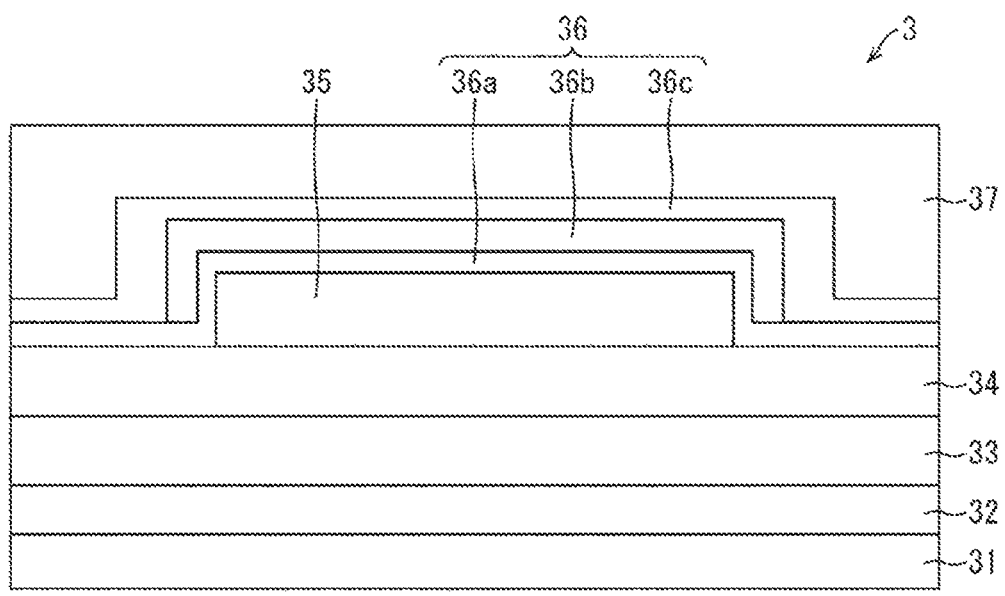

FIG. 10 is a cross-sectional view illustrating an example of a schematic configuration of the display panel according to the first embodiment.

Figure 11:
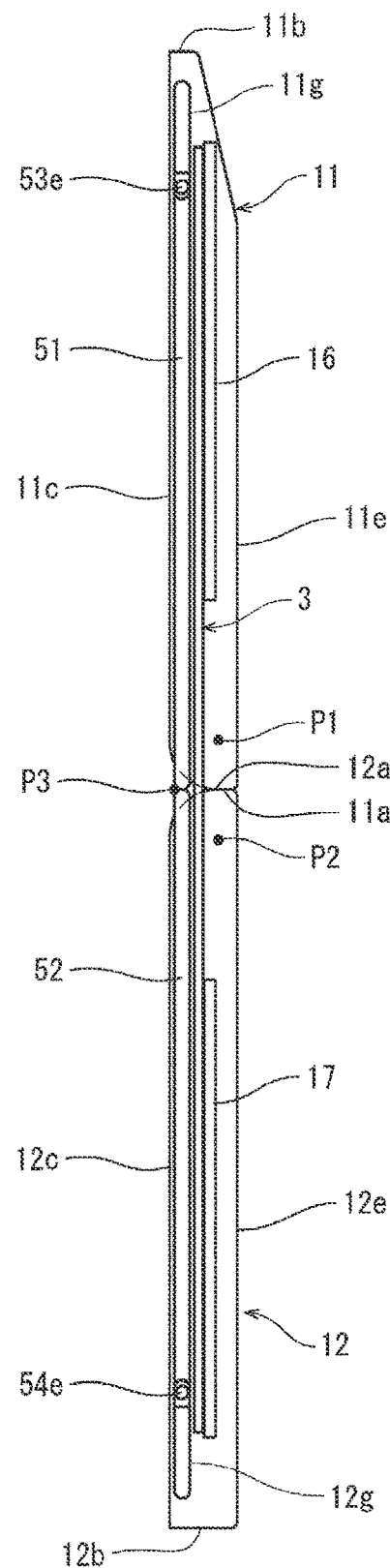

FIG. 11 is a schematic cross-sectional view illustrating an opening/closing operation of the display device according to the first embodiment.

Figure 12:
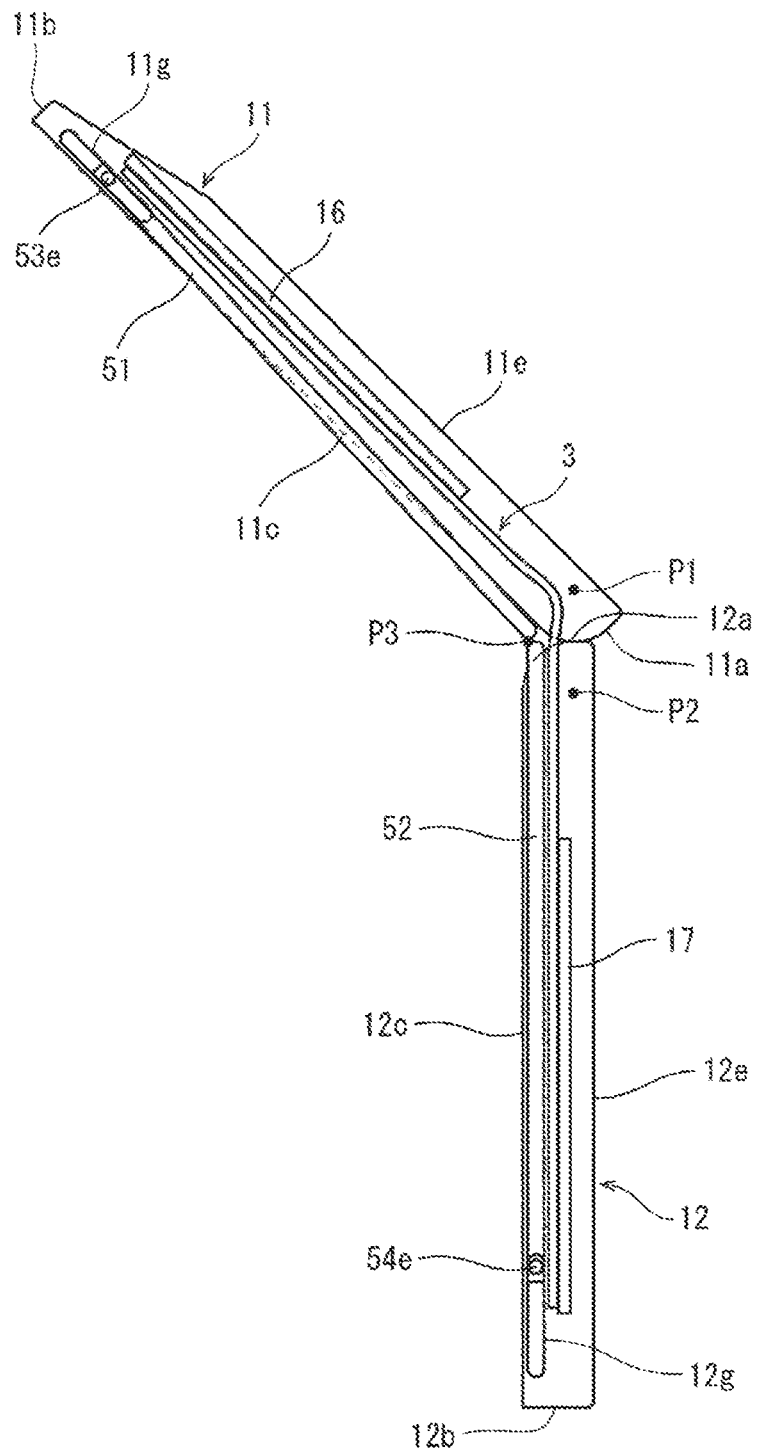

FIG. 12 is a schematic cross-sectional view illustrating the opening/closing operation of the display device according to the first embodiment.

Figure 13:
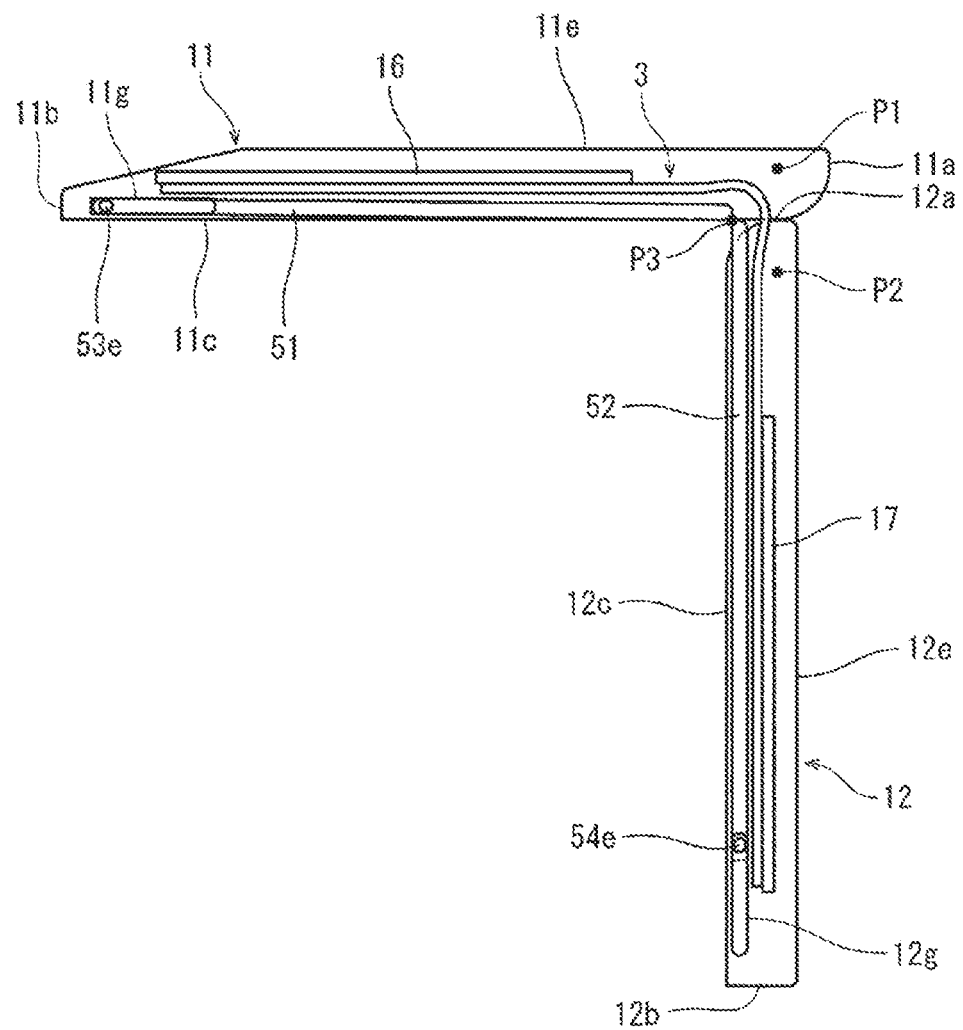

FIG. 13 is a schematic cross-sectional view illustrating the opening/closing operation of the display device according to the first embodiment.

Figure 14:
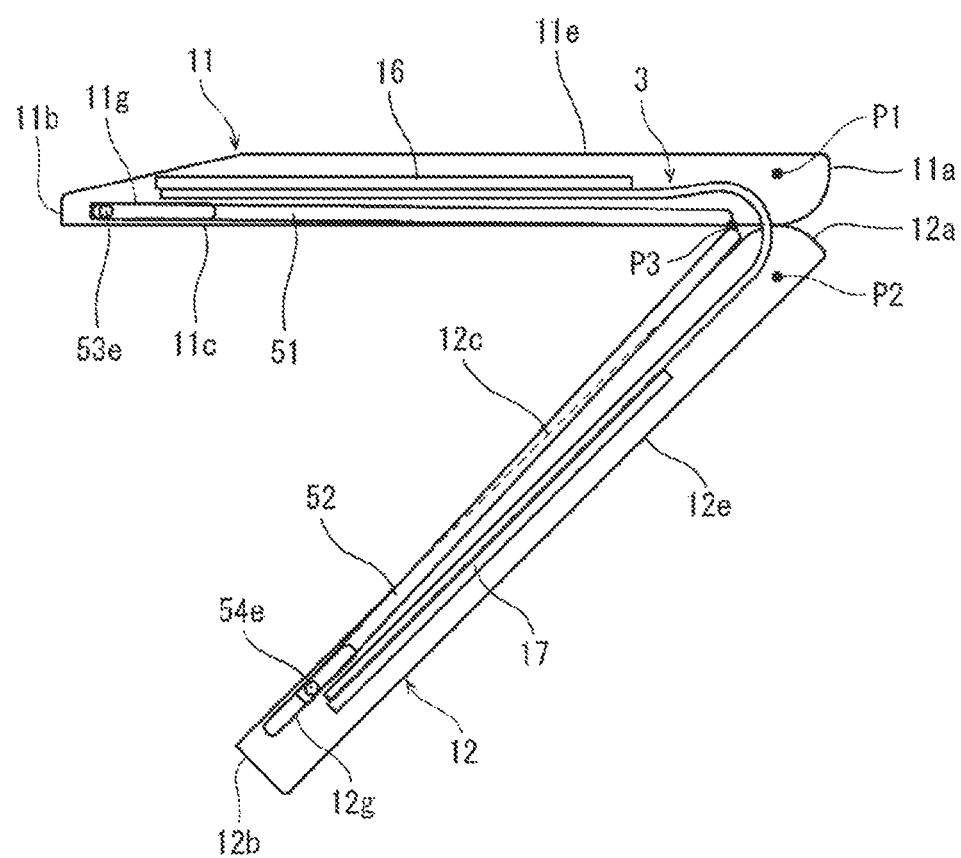

FIG. 14 is a schematic cross-sectional view illustrating the opening/closing operation of the display device according to the first embodiment.

Figure 15:
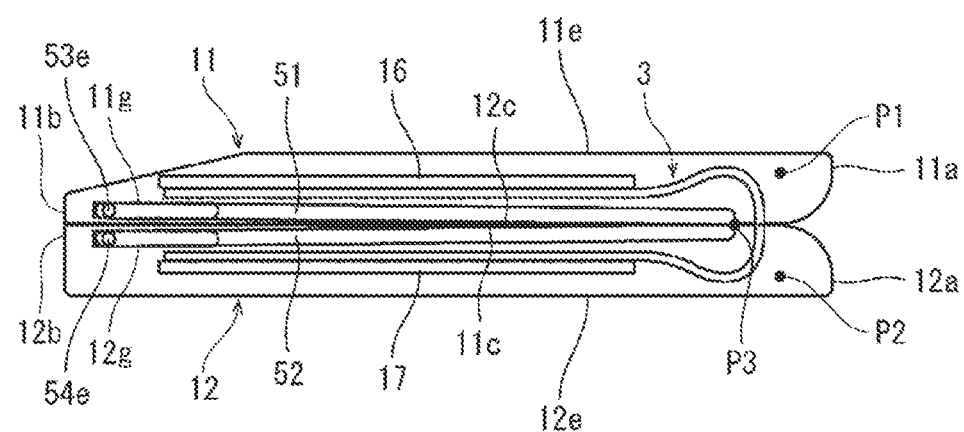

FIG. 15 is a schematic cross-sectional view illustrating the opening/closing operation of the display device according to the first embodiment.

Figure 16:
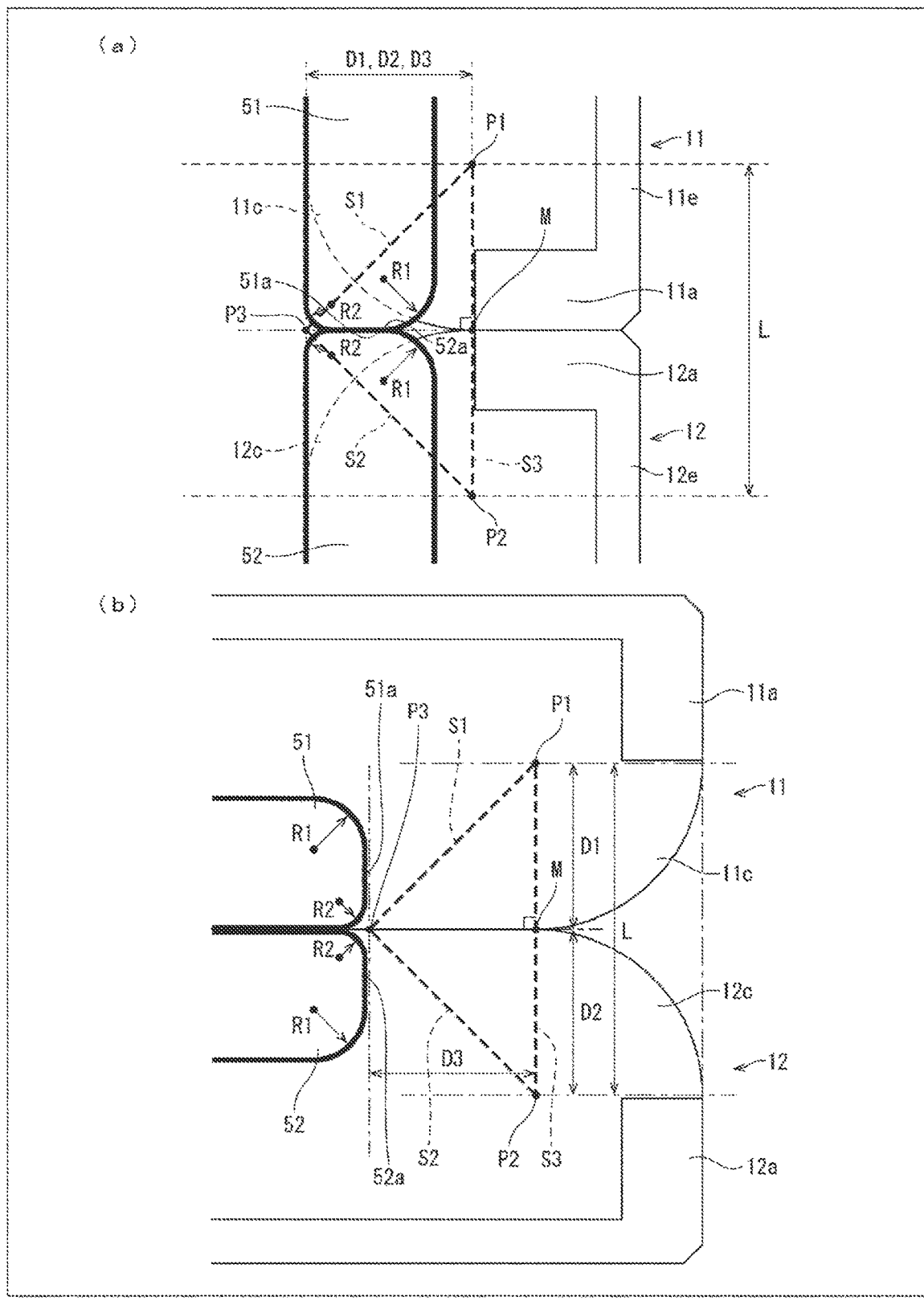

FIG. 16 is a schematic cross-sectional view illustrating a position of a rotation axis of a shaft in the display device according to the first embodiment.

Figure 17:
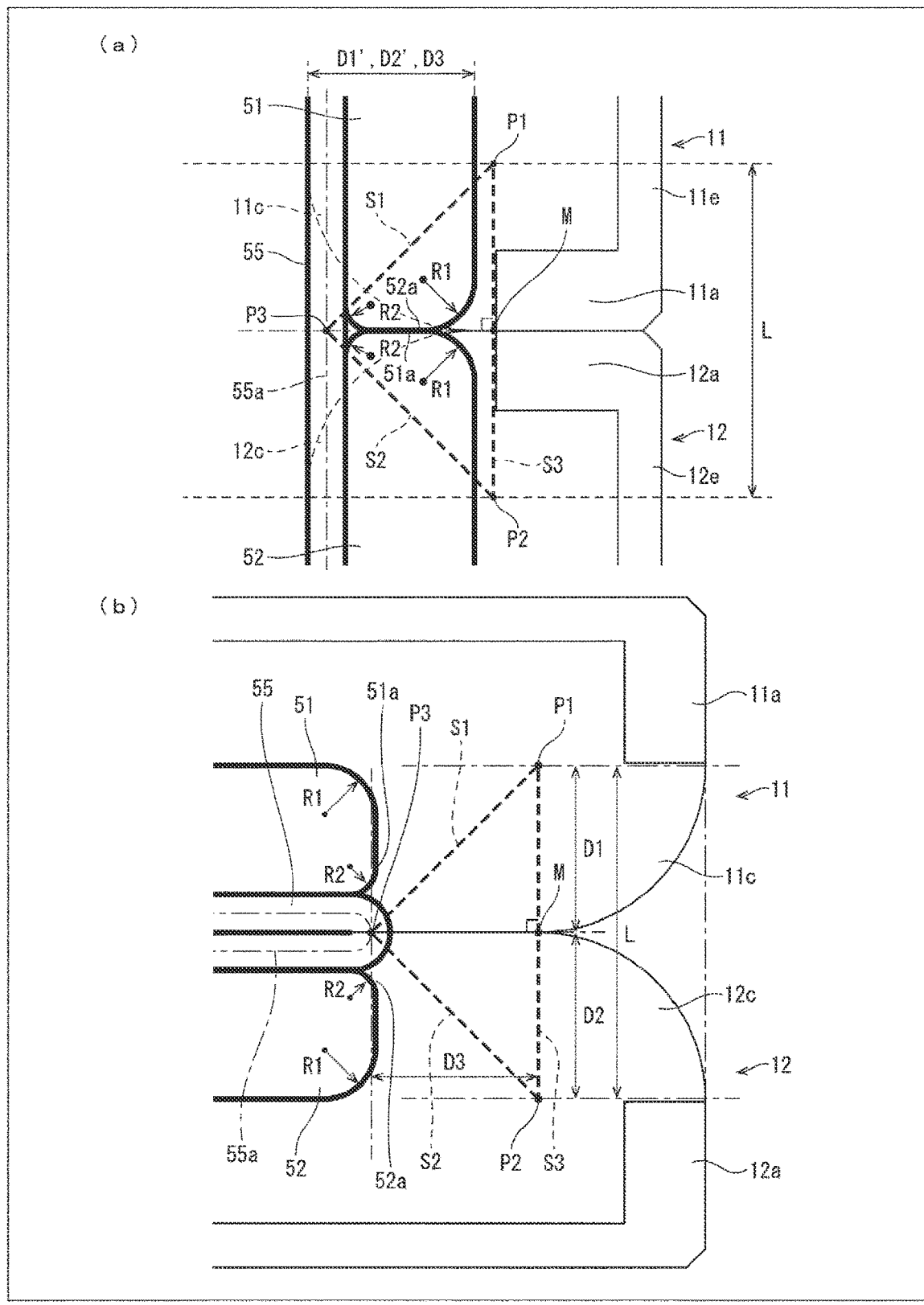

FIG. 17 is a schematic cross-sectional view illustrating a position of a rotation axis of a shaft in a display device according to a second embodiment.

FIG. 18(a) is a plan view illustrating a schematic configuration of a display device according to a third embodiment, and FIG. 18(b) is a cross-sectional view of a housing unit 2 illustrated in FIG. 18(a) taken along line B-B' in a direction of arrows.

Figure 18:
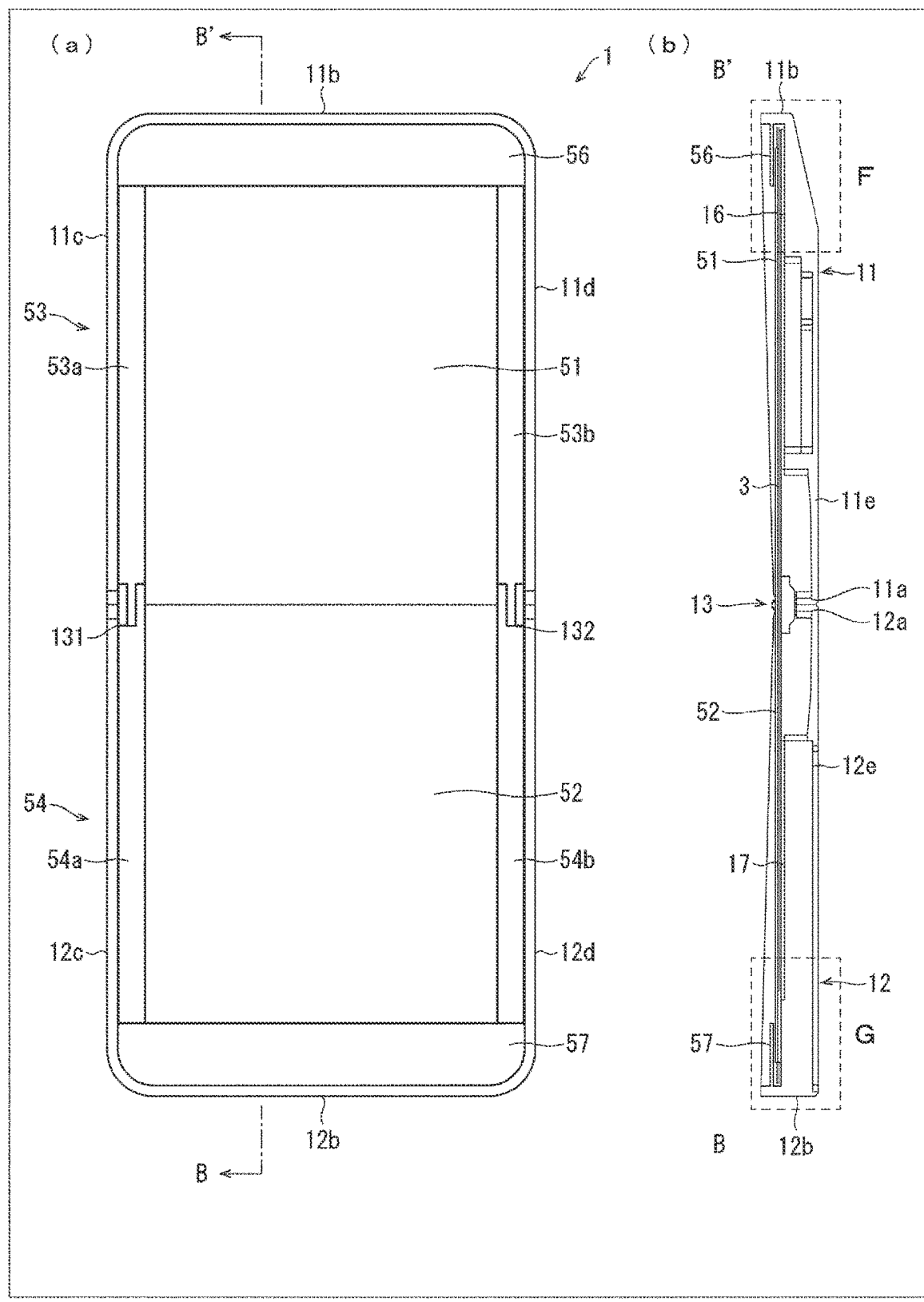
Figure 19:
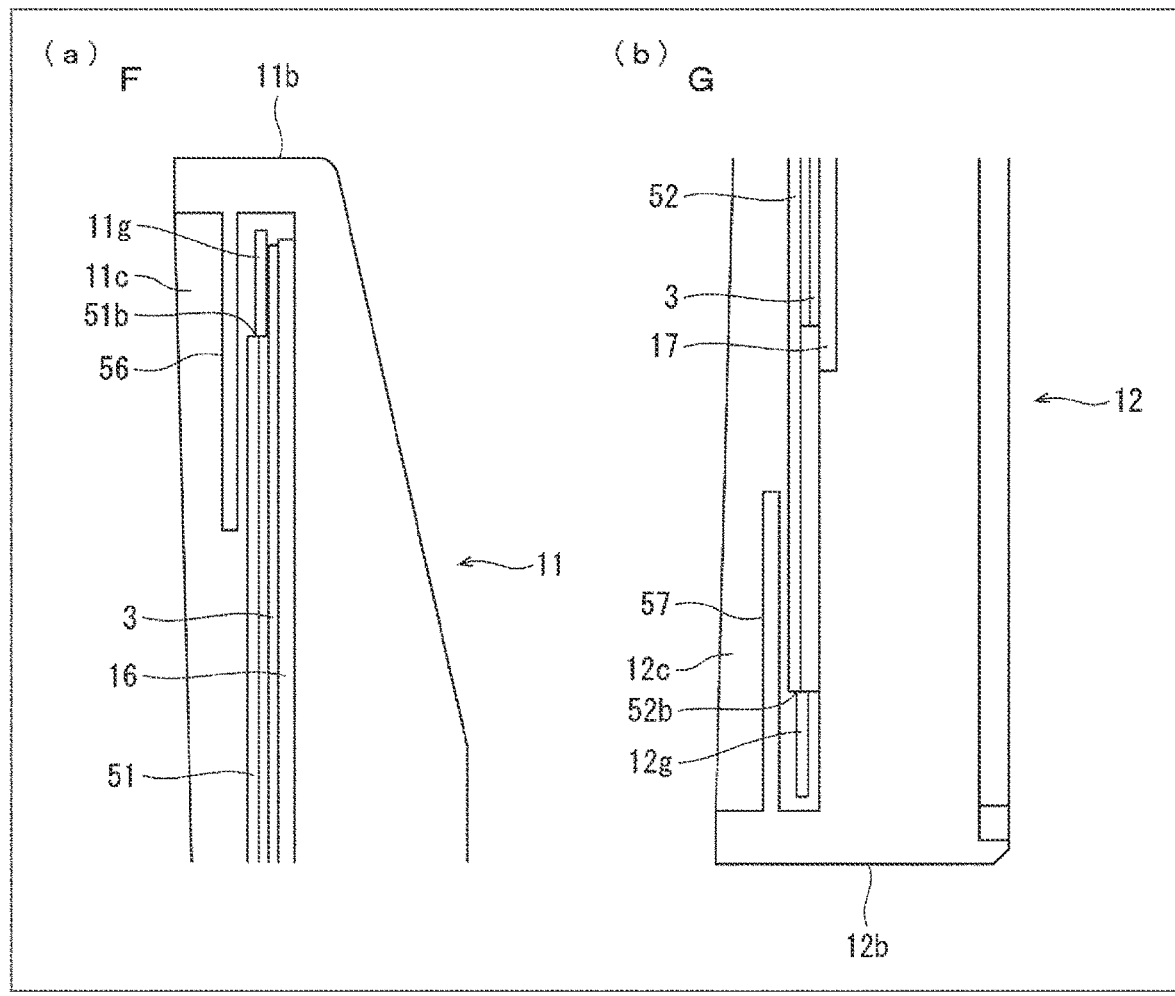

(a) of FIG. 19 is an enlarged cross-sectional view of main portions illustrating a portion F surrounded and indicated by broken lines in (b) of FIG. 18, and (b) of FIG. 19 is an enlarged cross-sectional view of main portions illustrating a portion G surrounded and indicated by broken lines in (b) of FIG. 18.

FIG. 20(a) is a plan view illustrating a schematic configuration of a housing unit according to a fourth embodiment, and FIG. 20(b) is a perspective view illustrating a state in which a second adhering plate is removed from the housing unit illustrated in FIG. 20(a).

Figure 20:
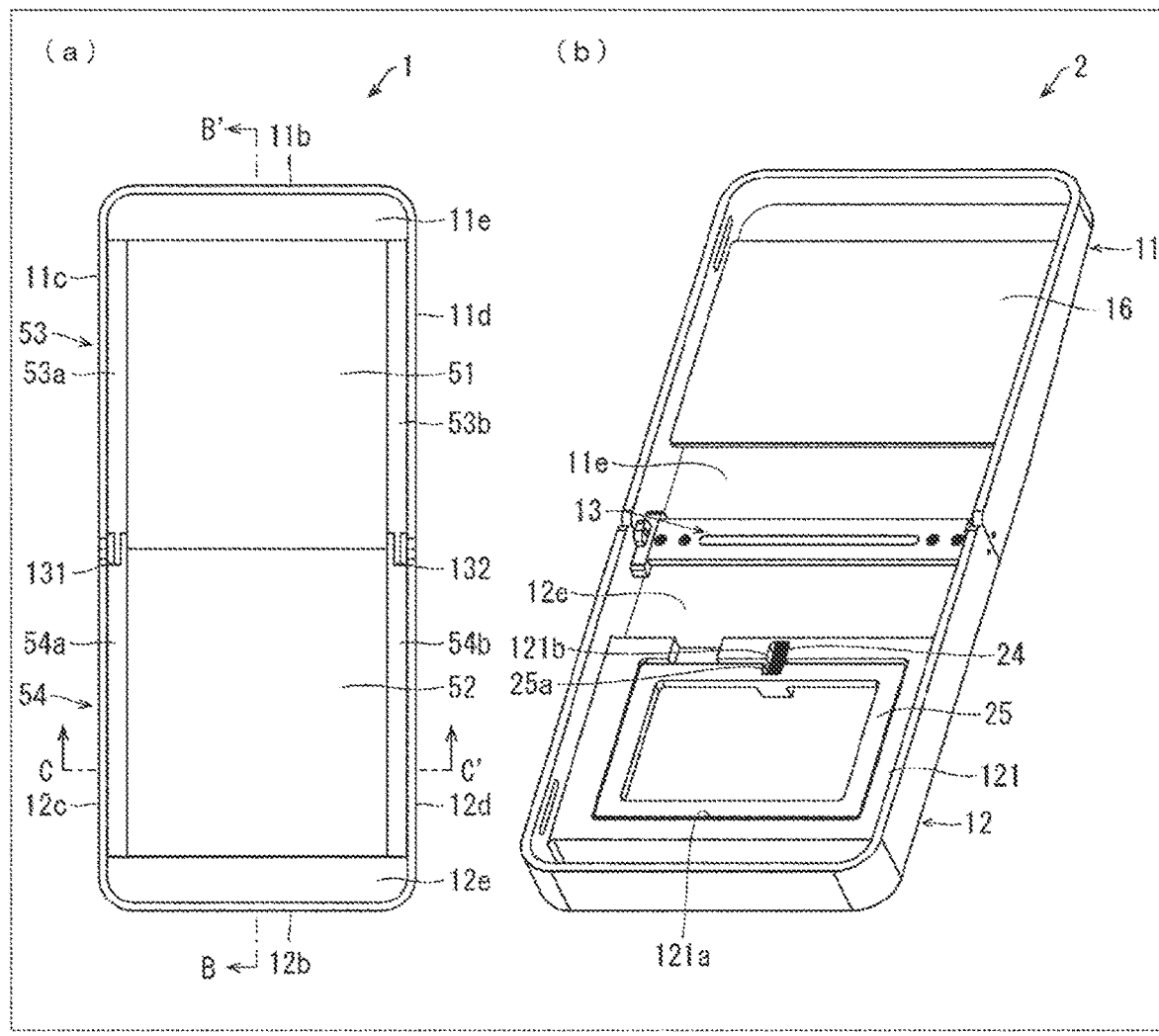

FIG. 21(a) is a cross-sectional view of the housing unit illustrated in (a) of FIG. 20 taken along line B-B' in a direction of arrows, and FIG. 21(b) is a cross-sectional view of the housing unit illustrated in (a) of FIG. 20 taken along line C-C' in a direction of arrows.

Figure 22:
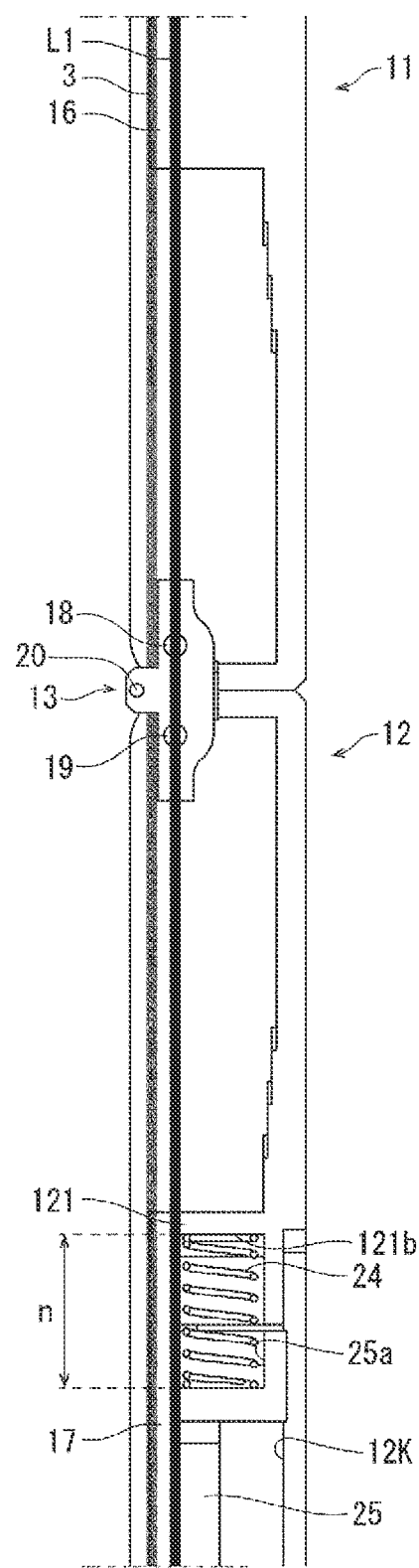

FIG. 22 is a cross-sectional view of main portions illustrating a relationship between a length of a display panel and a length of a face that passes over a first fulcrum and a second fulcrum and is parallel to a first housing and a second housing in a state in which the housing unit according to the fourth embodiment is deployed at 180 degrees.

FIG. 23(a) is a cross-sectional view of main portions illustrating a relationship between a length of an adhering surface of the display panel and a length of the face that passes over the first fulcrum and the second fulcrum and is parallel to the first housing and the second housing when the housing unit according to the fourth embodiment is started to be folded, and FIG. 23(b) is a cross-sectional view of main portions illustrating a state indicating a relationship between a length of the display panel and a length of the face that passes over the first fulcrum and the second fulcrum and is parallel to the first housing and the second housing when the housing unit is started to be folded in a state in which a first adhering plate and the second adhering plate are fixed to the corresponding first housing and the corresponding second housing.

Figure 24:
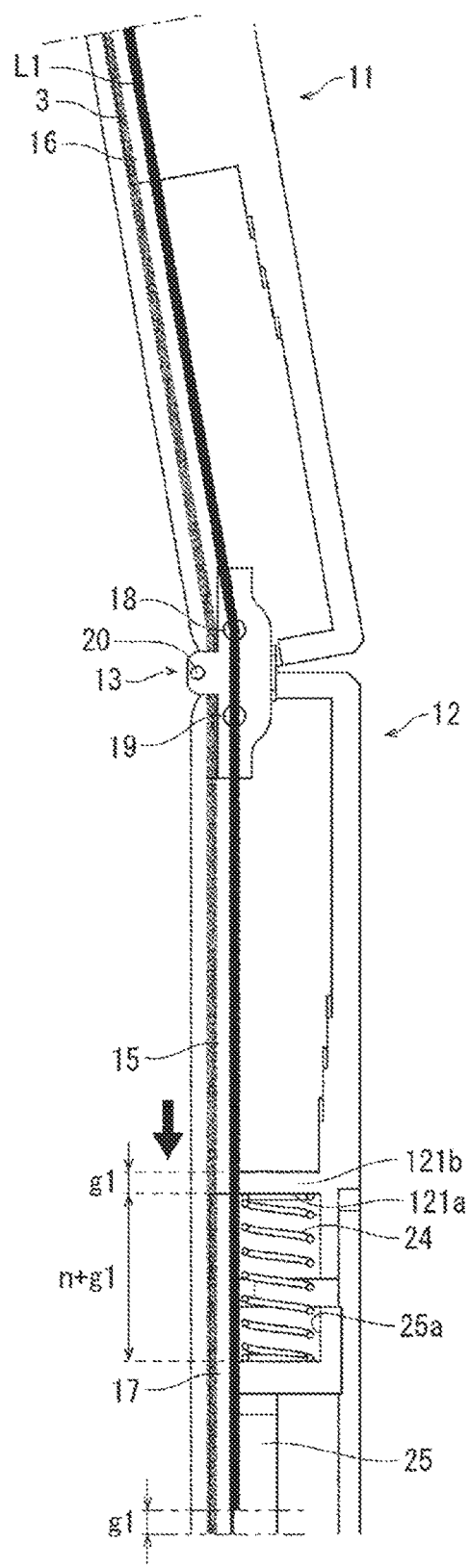

FIG. 24 is a cross-sectional view of main portions illustrating a relationship between a length of the display panel and a length of the face that passes over the first fulcrum and the second fulcrum and is parallel to the first housing and the second housing when the housing unit is started to be folded in the display device according to the fourth embodiment.

DESCRIPTION OF EMBODIMENTS

Hereinafter, embodiments of the disclosure will be described in detail. Note that members having the same functions as those of members described earlier in each embodiment below will be denoted by the same reference numerals and signs, and the description thereof will not be repeated.

First Embodiment

Figure 1:
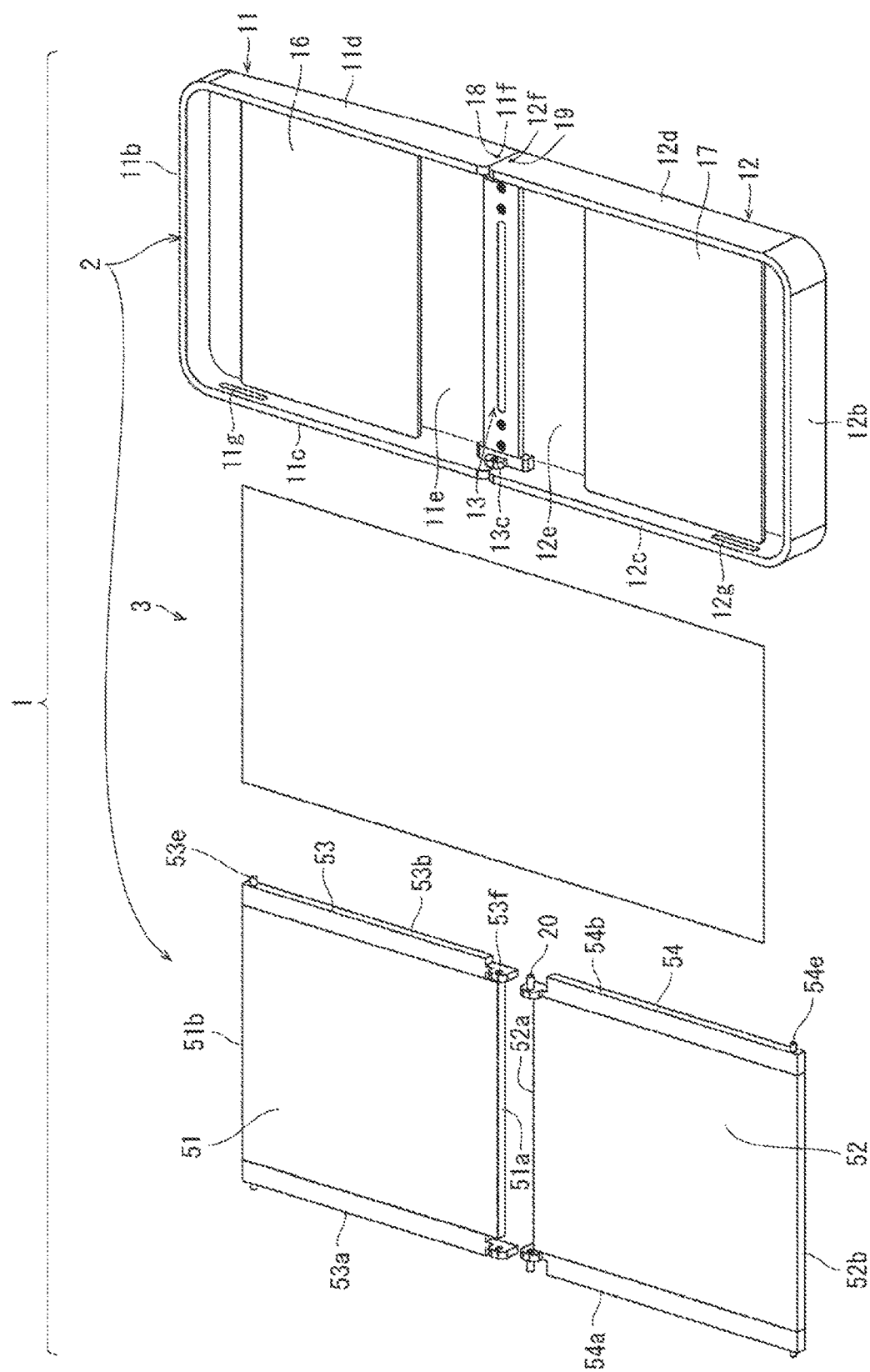
FIG. 1 is an exploded perspective view illustrating a schematic configuration of a display device according to a first embodiment.
Figure 2:
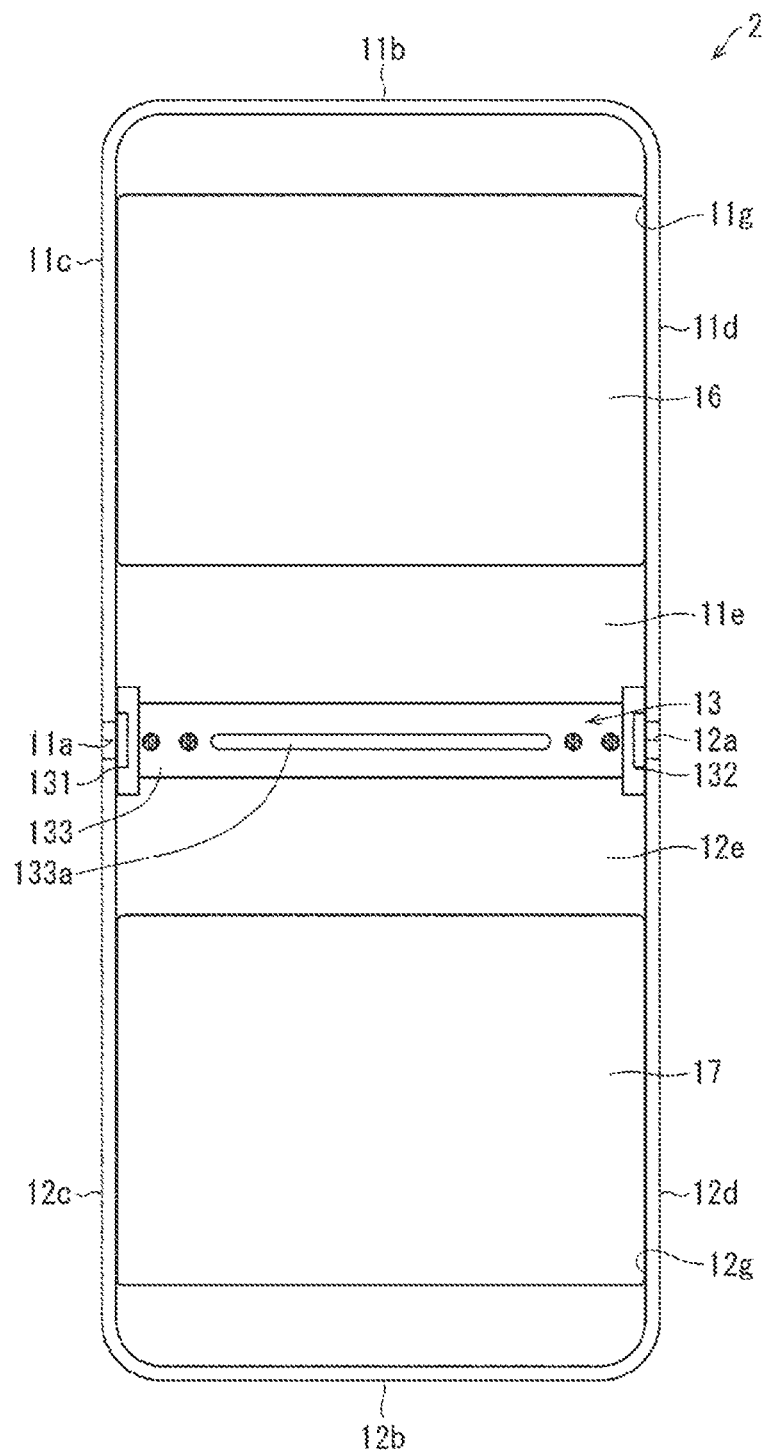
FIG. 2 is a schematic plan view illustrating a state in which a cover glass and a cover holder member are removed from a housing unit illustrated in FIG. 1.
Figure 3:
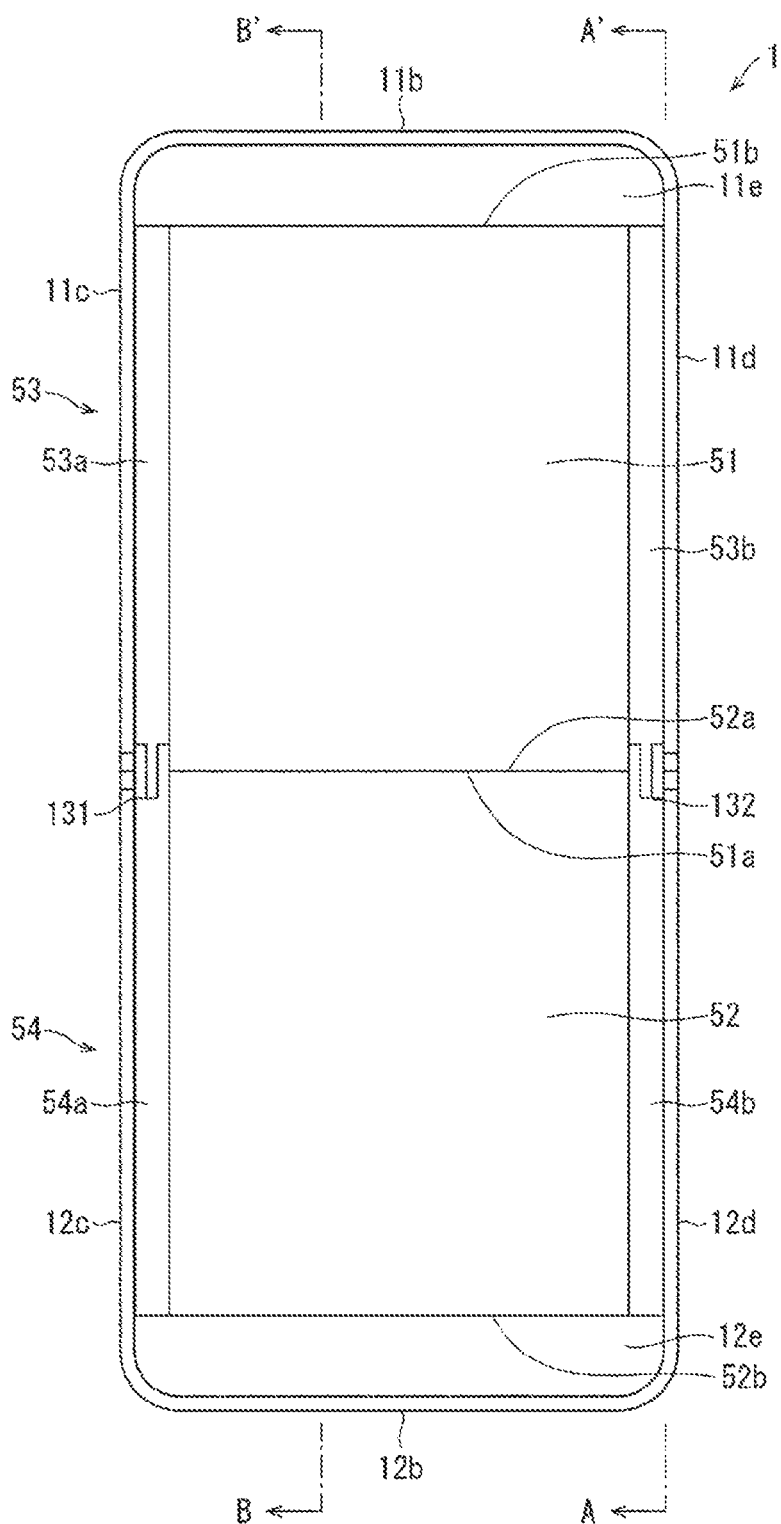
FIG. 3 is a plan view illustrating a schematic configuration of the display device illustrated in FIG. 1.
Figure 4:
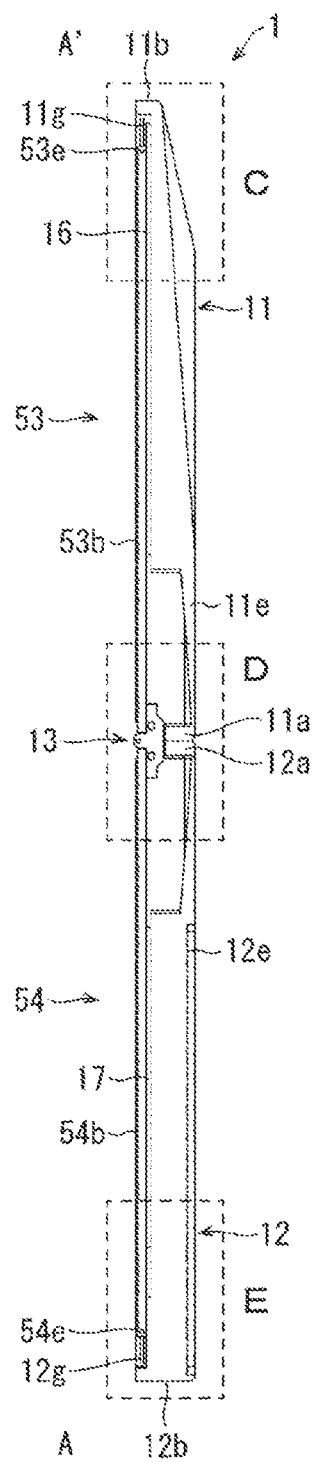
FIG. 4 is a cross-sectional view of the display device illustrated in FIG. 3 taken along line A-A' in a direction of arrows.
Figure 5:
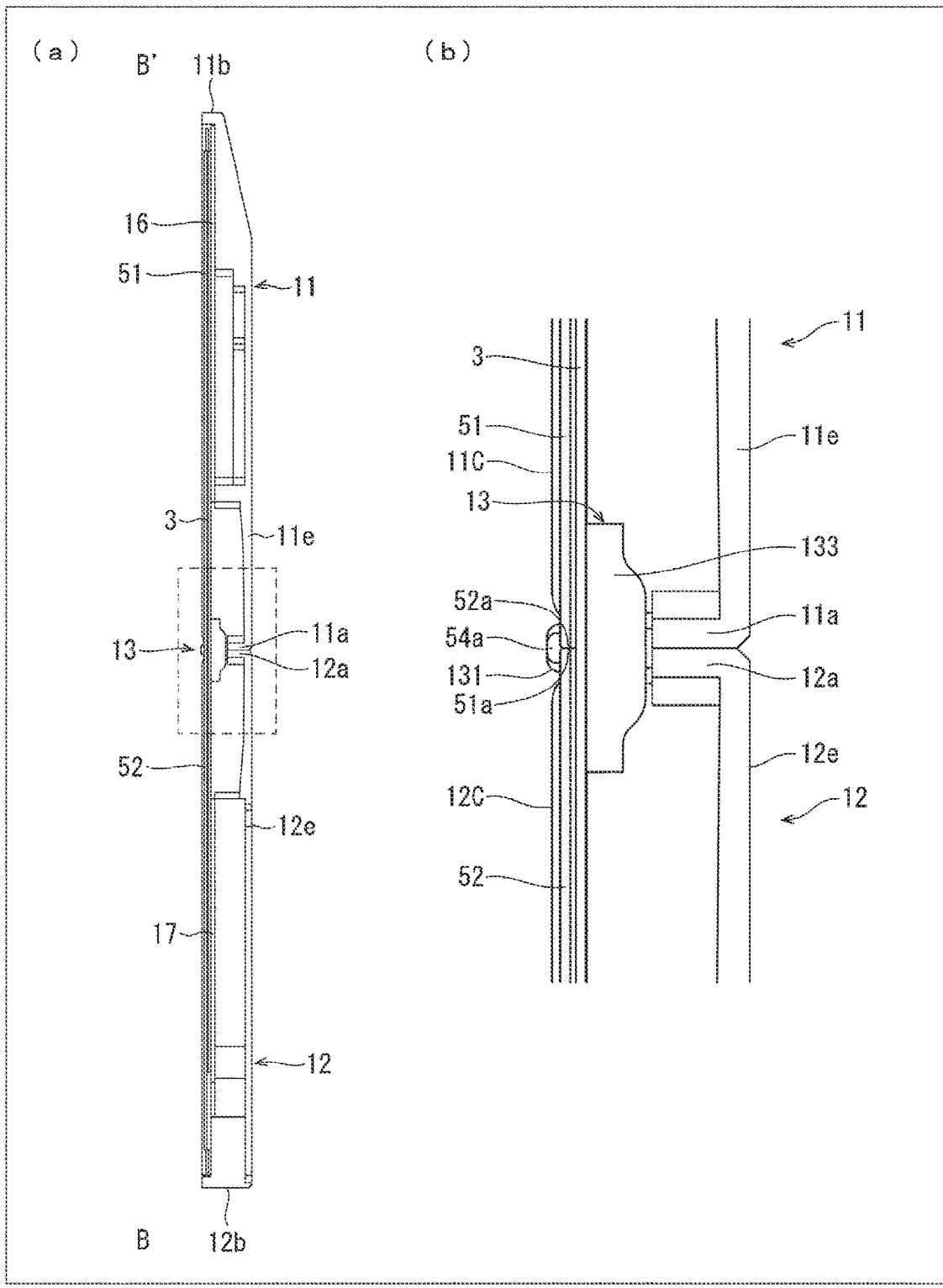
FIG. 5(a) is a cross-sectional view of the display device illustrated in FIG. 3 taken along line B-B' in a direction of arrows.
FIG. 5(b) is an enlarged cross-sectional view of main portions illustrating a portion surrounded and indicated by broken lines in FIG. 5(a).
Figure 6:
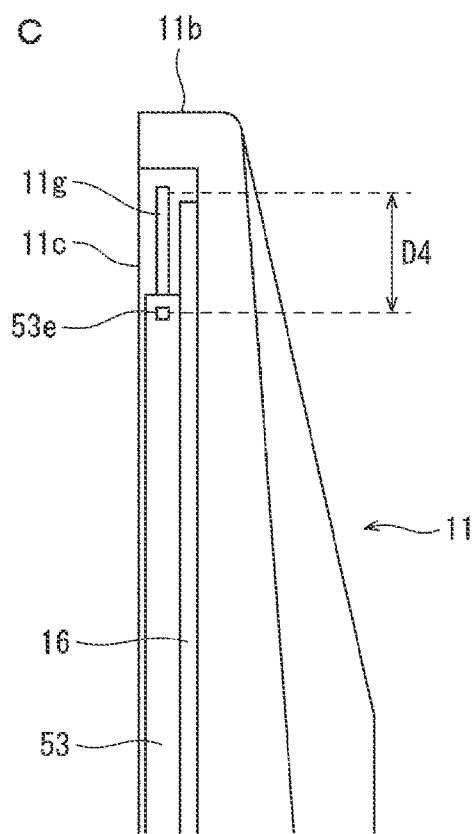
FIG. 6 is an enlarged cross-sectional view of main portions illustrating a portion C surrounded and indicated by broken lines in FIG. 4.
Figure 7:
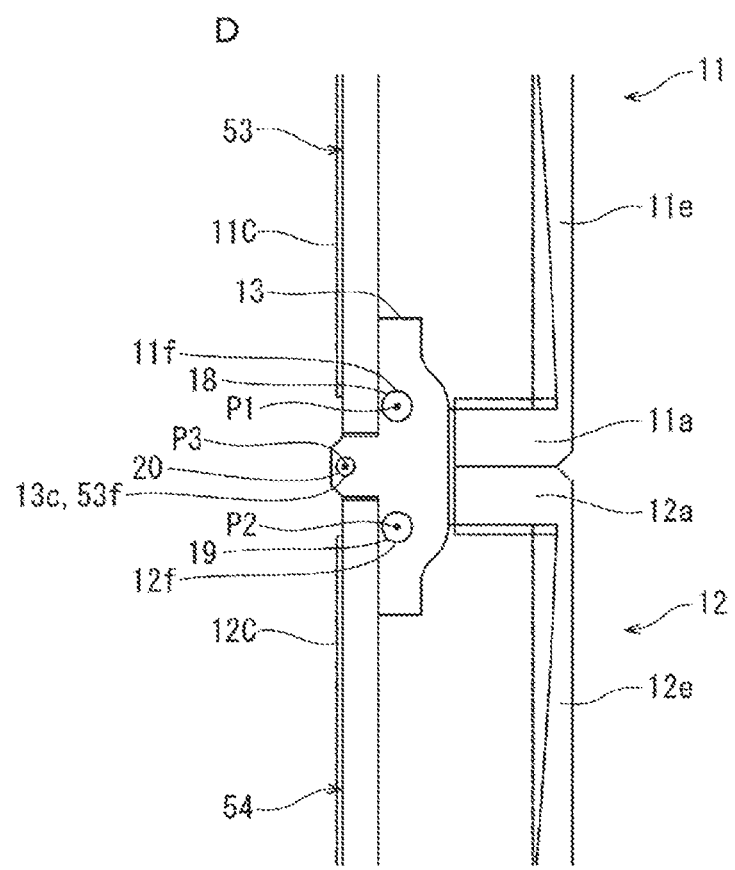
FIG. 7 is an enlarged cross-sectional view of main portions illustrating a portion D surrounded and indicated by broken lines in FIG. 4.
Figure 8:
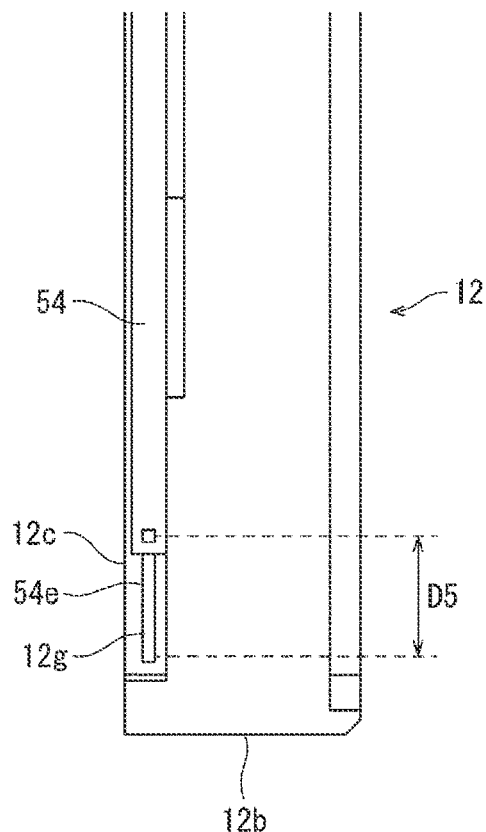
FIG. 8 is an enlarged cross-sectional view of main portions illustrating a portion E surrounded and indicated by broken lines in FIG. 4.

FIG. 1 is an exploded perspective view illustrating a schematic configuration of a display device 1 according to the present embodiment. FIG. 2 is a schematic plan view illustrating a state in which a first cover glass 51 (first cover member), a second cover glass 52 (second cover member), a first cover holder member 53, and a second cover holder member 54 are removed from a housing unit 2 according to the present embodiment. FIG. 3 is a plan view illustrating a schematic configuration of the display device 1 according to the present embodiment. FIG. 4 is a cross-sectional view of the housing unit 2 illustrated in FIG. 3 taken along line A-A' in a direction of arrows. (a) of FIG. 5 is a cross-sectional view of the housing unit 2 illustrated in FIG. 3 taken along line B-B' in a direction of arrows, and (b) of FIG. 5 is an enlarged cross-sectional view of main portions illustrating a portion surrounded and indicated by broken lines in (a) of FIG. 5. FIG. 6 is an enlarged cross-sectional view of main portions illustrating a portion C surrounded and indicated by broken lines in FIG. 4. FIG. 7 is an enlarged cross-sectional view of main portions illustrating a portion D surrounded and indicated by broken lines in FIG. 4. FIG. 8 is an enlarged cross-sectional view of main portions illustrating a portion E surrounded and indicated by broken lines in FIG. 4. (a) of FIG. 9 is an enlarged exploded view of main portions illustrating a relationship among a hinge member 13, the first cover holder member 53, the second cover holder member 54, a first housing 11, and a second housing 12, and (b) of FIG. 9 is an enlarged view of main portions illustrating a relationship of the hinge member 13, the first cover holder member 53, the second cover holder member 54, the first cover glass 51, and the second cover glass 52 with respect to a display panel 3 through the first housing 11 and the second housing 12.

In (b) of FIG. 9, contours of the first housing 11 and the second housing 12 are indicated by dot-dash lines, and a contour of the hinge member 13 is indicated by a solid line. Further, of contours of the display panel 3, the first cover holder member 53, and the second cover holder member 54, a portion that does not overlap the hinge member 13 is indicated by a solid line, and a portion that overlaps the hinge member 13 and is hidden is indicated by a rough broken line. Further, contours of the first cover glass 51 and the second cover glass 52 are indicated by a fine broken line.

As illustrated in FIG. 1, the display device 1 according to the present embodiment is a foldable (freely foldable) display device including the housing unit 2 being foldable and the display panel 3 with flexibility.

The display device 1 can select an arbitrary state between a folded state (namely, a closed state) in which the display device 1 is folded, and a deployed state (namely, an open state) in which the display device 1 is not folded, by an opening/closing operation.

Note that, unless stated otherwise below, a state in which the display device 1 (or the housing unit 2 described below) is open (deployed state) refers to a state in which the display device 1 (or the housing unit 2 described below) is deployed at 180 degrees, that is, a so-called fully flat state.

As illustrated in FIG. 1, FIG. 2, and FIG. 9, the housing unit 2 includes the first housing 11, the second housing 12, the hinge member 13, a first adhering plate 16, a second adhering plate 17, a first shaft 18 (first fulcrum), a second shaft 19 (second fulcrum), a third shaft 20 (third fulcrum), the first cover glass 51, the second cover glass 52, the first cover holder member 53, and the second cover holder member 54. As illustrated in FIG. 5, the display panel 3 is disposed between (i) the first housing 11 and the second housing 12 and (ii) the first cover glass 51 and the second cover glass 52.

A description is given below in which, in the display device 1 and the housing unit 2, the first cover glass 51 side and the second cover glass 52 side are defined as an upper face side, and the first housing 11 side and the second housing 12 side are defined as a lower face side (or a rear face side or a back face side).

First Housing and Second Housing

The first housing 11 and the second housing 12 are each a box-shaped container that is formed in a frame shape including back plates 11e and 12e and that has an opening in an upper face. The first housing 11 and the second housing 12 are each formed of a highly rigid material used as a housing for a display device in the related art.

The first housing 11 and the second housing 12 are disposed facing each other such that, in a state in which the housing unit 2 is deployed, one end face (outer face in one sidewall) of the first housing 11 and one end face (outer face in one sidewall) of the second housing 12 are adjacent to each other.

In the present embodiment, the first housing 11 and the second housing 12 each have a rectangular shape, and as illustrated in FIG. 2 and FIG. 7, the first housing 11 and the second housing 12 are disposed facing each other such that, in a state in which the housing unit 2 is deployed, an outer face of one sidewall 11b of two sidewalls 11a and 11b parallel to the short-hand direction of the first housing 11 and an outer face of one sidewall 12b of two sidewalls 12a and 12b parallel to the short-hand direction of the second housing 12 are adjacent to each other.

The first housing 11 and the second housing 12 have the same size in a plan view, and, although not illustrated, are formed such that the first housing 11 and the second housing 12 completely overlap in a plan view when the display device 1 is folded.

First Cover Glass and Second Cover Glass

The first cover glass 51 (first cover member) and the second cover glass 52 (second cover member) have rigidity for protecting the display panel 3 from a pressing force of a touch operation by a user, and transparency that allows a user to view an image displayed in a display region of the display panel 3 through the first cover glass 51 and the second cover glass 52. The first cover glass 51 and the second cover glass 52 are not limited to glass, and may be formed of a material having rigidity and transparency such as a transparent resin including a polycarbonate. When the first cover glass 51 is formed of a resin, the first cover glass 51 may be integrally formed with the first cover holder member 53. Similarly, when the second cover glass 52 is formed of a resin, the second cover glass 52 may be integrally formed with the second cover holder member 54.

The first cover glass 51 and the second cover glass 52 are disposed facing each other such that, in a state in which the housing unit 2 is deployed, one end face (outer face in one sidewall) of the first cover glass 51 and one end face (outer face in one sidewall) of the second cover glass 52 are adjacent to each other.

In the present embodiment, the first cover glass 51 and the second cover glass 52 each have a rectangular shape, and have a lower face (first main surface) facing the display panel 3, an upper face (second main surface) on an opposite side to the lower face, and a side surface perpendicular to the lower face and the upper face. As illustrated in FIG. 1, FIG. 3, and (b) of FIG. 5, the first cover glass 51 and the second cover glass 52 are disposed facing each other such that, in a state in which the housing unit 2 is deployed, one side surface 51a of two side surfaces 51a and 51b parallel to the short-hand direction of the first cover glass 51 and one side surface 52a of two side surfaces 52a and 52b parallel to the short-hand direction of the second cover glass 52 are adjacent to each other.

The first cover glass 51 corresponds to the first housing 11 and is smaller than the first housing 11 in a plan view. The first cover glass 51 covers a display surface of the display panel 3 in a display region (first display region) corresponding to the first housing 11. The second cover glass 52 corresponds to the second housing 12 and is smaller than the second housing 12 in a plan view. The second cover glass 52 covers a display surface of the display panel 3 in a display region (second display region) corresponding to the second housing 12. The first display region and the second display region of the display panel 3 are adjacent to each other.

In the present embodiment, the first cover glass 51 and the second cover glass 52 have the same size in a plan view, and, although not illustrated, are formed such that the first cover glass 51 and the second cover glass 52 completely overlap in a plan view when the display device 1 is folded. The short-hand direction of the first cover glass 51 is parallel to the short-hand direction of the first housing 11, and the longitudinal direction of the first cover glass 51 is substantially parallel to the longitudinal direction of the first housing 11. The short-hand direction of the second cover glass 52 is parallel to the short-hand direction of the second housing 12, and the longitudinal direction of the second cover glass 52 is substantially parallel to the longitudinal direction of the second housing 12.

First Cover Holder and Second Cover Holder

The first cover holder member 53 and the second cover holder member 54 are a frame formed so as to hold the first cover glass 51 and the second cover glass 52, respectively. The first cover holder member 53 and the second cover holder member 54 are each formed of a highly rigid material used as a cover holder for a display device in the related art.

In the present embodiment, as illustrated in FIG. 1 and FIG. 3, the first cover holder member 53 is formed of two straight frame portions 53a and 53b that are each attached to the side surface parallel to the longitudinal direction of the first cover glass 51. Similarly, the second cover holder member 54 is formed of two straight frame portions 54a and 54b that are each attached to the side surface parallel to the longitudinal direction of the second cover glass 52.

As illustrated in FIG. 9, the first cover holder member 53 and the second cover holder member 54 are configured such that an upper face of the frame portion of the first cover holder member 53 is completely or nearly flush with the upper face of the first cover glass 51, and an upper face of the frame portion of the second cover holder member 54 is completely or nearly flush with the upper face of the second cover glass 52. In this way, no step is generated between the first cover holder member 53 and the upper face of the first cover glass 51 and between the second cover holder member 54 and the upper face of the second cover glass 52, and thus an appearance of the display device 1 on a display surface side can be made flat. In addition, the first cover holder member 53 and the second cover holder member 54 are preferably configured such that a lower face of the frame portion of the first cover holder member 53 is completely or nearly flush with the lower face of the first cover glass 51, and a lower face of the frame portion of the second cover holder member 54 is completely or nearly flush with the lower face of the second cover glass 52. The display region of the display panel 3 is disposed on the back face side of the first cover glass 51 and the second cover glass 52 such that an image displayed in the display region is visible to a user, and the frame region surrounding the display region of the display panel 3 is disposed on the back face side of the first cover holder member 53 and the second cover holder member 54 such that the frame region is hidden from a user. Therefore, no step is generated between the first cover holder member 53 and the lower face of the first cover glass 51 and between the second cover holder member 54 and the lower face of the second cover glass 52. Thus, while the display device 1 is deployed at 180 degrees, the first cover glass 51 and the second cover glass 52 can abut on the display region of the display panel 3, and the first cover holder member 53 and the second cover holder member 54 can also abut on the frame region of the display panel 3. In this way, in a state in which the display device 1 is deployed at 180 degrees, the display panel 3 can be suppressed to be flat, and thus an image displayed in the display region of the display panel 3 is easily viewed by a user.

The first cover holder member 53 and the second cover holder member 54 are connected to the first housing 11 and the second housing 12, respectively, such that the first cover holder member 53 and the second cover holder member 54 can slide in parallel with the longitudinal direction of the first housing 11 and the second housing 12.

In the present embodiment, as illustrated in FIG. 1 and FIG. 6, two frame portions 53a and 53b of the first cover holder member 53 are each provided with a projection 53e (first projection) that is located on an end portion (second end portion) on a side farther from the second cover holder member 54 (i.e., from the hinge member 13) in a state in which the housing unit 2 is deployed, and that protrudes toward the sidewalls 11c and 11d parallel to the longitudinal direction of the first housing 11. Inner faces of the sidewalls 11c and 11d in the longitudinal direction of the first housing 11 are each provided with a long hole 11g (first long hole), which corresponds to the projection 53e, on a side farther from the second housing 12 (i.e., from the hinge member 13) in a state in which the housing unit 2 is deployed.

The projections 53e are each slidably engaged with the long hole 11g. The long holes 11g each extend in parallel with the longitudinal direction of the first housing 11. The long hole 11g may be a through hole or a non-through hole (i.e., a groove), but is preferably a non-through hole from the perspective of preventing dust from entering the first housing 11. No such limitation is intended, and a long hole may be provided in the first cover holder member 53, and a projection that is slidably engaged with the long hole may be provided on the first housing 11.

Similarly, as illustrated in FIG. 1 and FIG. 8, two frame portions 54a and 54b of the second cover holder member 54 are each provided with a projection 54e (second projection) that is located on an end portion (second end portion) on a side farther from the first cover holder member 53 (i.e., from the hinge member 13) in a state in which the housing unit 2 is deployed, and that protrudes toward the sidewalls 12c and 12d parallel to the longitudinal direction of the second housing 12. Inner faces of the sidewalls 12c and 12d in the longitudinal direction of the second housing 12 are each provided with a long hole 12g (second long hole), which corresponds to the projection 54e, on a side farther from the first housing 11 (i.e., from the hinge member 13) in a state in which the housing unit 2 is deployed.

The projections 54e are each slidably engaged with the long hole 12g. The long holes 12g each extend in parallel with the longitudinal direction of the second housing 12. The long hole 12g may be a through hole or a non-through hole (i.e., a groove), but is preferably a non-through hole from the perspective of preventing dust from entering the second housing 12. No such limitation is intended, and a long hole may be provided in the second cover holder member 54, and a projection that is slidably engaged with the long hole may be provided on the second housing 12.

Hinge Member

The hinge member 13 according to the present embodiment is a polyaxial hinge. The hinge member 13 is formed in an elongated shape (a band shape elongated in one direction) and is attached to the first housing 11 and the second housing 12 so as to extend across the first housing 11 and the second housing 12 along the one end face of the first housing 11 and the one end face of the second housing 12 (in other words, in the direction of extension of the sidewalls 11b and 12b).

The hinge member 13 is attached to the first housing 11 and the second housing 12 such that, as illustrated in FIG. 2, one end face of both end faces parallel to the short-hand direction of the hinge member 13, which are attachment surfaces to the first housing 11 and the second housing 12, abuts on the inner faces of the sidewalls 11c and 12c so as to extend across the sidewalls 11c and 12c adjacent to each other in the longitudinal direction of the first housing 11 and the second housing 12, while the other end face abuts on the inner faces of the sidewalls 11d and 12d facing the sidewalls 11c and 12c so as to extend across the sidewalls 11d and 12d adjacent to each other in the longitudinal direction of the first housing 11 and the second housing 12.

The hinge member 13 is attached to the first housing 11 and the second housing 12 such that, as illustrated in FIG. 7, the rear face thereof abuts on the upper faces of the sidewalls 11*b* and 12*b* so as to extend across the sidewalls 11*b* and 12*b* adjacent to each other in the short-hand direction of the first housing 11 and the second housing 12 in a state in which the housing unit 2 is deployed.

Specifically, as illustrated in FIG. 2, the hinge member 13 includes a first attachment portion 131 and a second attachment portion 132 having the attachment surfaces, and a connecting portion 133 having an elongated shape (a band shape elongated in one direction) that connects the first attachment portion 131 and the second attachment portion 132. The first attachment portion 131 abuts on the inner faces of the sidewalls 11*c* and 12*c* (first side portion) on one side (left side in FIG. 2 and FIG. 3) so as to extend across the sidewalls 11*c* and 12*c*, and the second attachment portion 132 abuts on the inner faces of the sidewalls 11*d* and 12*d* (second side portion) on the other side (right side in FIG. 2 and FIG. 3) so as to extend across the sidewalls 11*d* and 12*d*. The connecting portion 133 has a lower face that abuts on the upper faces of the sidewalls 11*b* and 12*b* so as to extend across the sidewalls 11*b* and 12*b* in a state in which the housing unit 2 is deployed. The connecting portion 133 has the lower face that abuts on the inner faces of the sidewalls 11*b* and 12*b* so as to extend across the sidewalls 11*b* and 12*b* in a state in which the housing unit 2 is folded. The connecting portion 133 has an upper face that abuts on the display panel 3 in a state in which the housing unit 2 is folded. This abutment stabilizes the folded display panel 3. Further, the upper face of the connecting portion 133 is planar.

In addition, the hinge member 13 is also attached to the first cover holder member 53 and the second cover holder member 54.

Specifically, for example, as illustrated in FIG. 3, the first attachment portion 131 abuts on an outer face of the first cover holder member 53, and the first cover holder member 53 abuts on an outer surface of the second cover holder member 54.

Shaft and Shaft Hole

As illustrated in FIG. 7, the first shaft 18, the third shaft 20, and the second shaft 19 according to the present embodiment are provided in this order in the short-hand direction of the hinge member 13.

As illustrated in FIG. 9, the first shaft 18 and the second shaft 19 are integrally formed with the hinge member 13, and the third shaft 20 is integrally formed with the second cover holder member 54. Therefore, in the hinge member 13, the first shaft 18, a shaft hole 13*c* for inserting the third shaft 20, and the second shaft 19 are provided in this order from the first housing 11 side toward the second housing 12 side in the short-hand direction of the hinge member 13.

The first shaft 18 is a first hinge axis, and connects the hinge member 13 and one end portion of the first housing 11 so as to allow the hinge member 13 and the first housing 11 to relatively rotatably connect each other. Specifically, as illustrated in (a) of FIG. 9, the first shaft 18 integrally formed with the hinge member 13 is rotatably inserted into a shaft hole 11*f* provided in each end portion of the first housing 11 facing the hinge member 13 in the longitudinal direction of the hinge member 13 (specifically, each end portion of the sidewalls 11*c* and 11*d* of the first housing 11 on the second housing 12 side which are parallel to the longitudinal direction). In this way, the first shaft 18 connects the hinge member 13 and the end portions of the first housing 11 on the sidewall 11*b* side so as to allow the hinge member 13 and the first housing 11 to relatively rotatably connect each other. Therefore, the first shaft 18 functions as a first fulcrum that relatively rotatably connects the hinge member 13 and the first housing 11. As illustrated in (b) of FIG. 9, a rotation axis P1 of the first shaft 18 (a rotation axis of the first fulcrum) is disposed on the first housing 11 side with respect to the display panel 3 when viewed from an axial direction of the first shaft 18. Here, the first housing 11 side particularly refers to the back plate 11*e* side (a so-called "back face side") of the first housing 11.

The second shaft 19 is a second hinge axis, and connects the hinge member 13 and one end portion of the second housing 12 so as to allow the hinge member 13 and the second housing 12 to relatively rotatably connect each other. Specifically, as illustrated in (a) of FIG. 9, the second shaft 19 integrally formed with the hinge member 13 is rotatably inserted into a shaft hole 12*f* provided in an end portion of the second housing 12 facing the hinge member 13 in the longitudinal direction of the hinge member 13 (specifically, each end portion of the sidewalls 12*c* and 12*d* of the second housing 12 on the first housing 11 side which are parallel to the longitudinal direction). In this way, the first shaft 19 connects the hinge member 13 and the end portions of the second housing 12 on the sidewall 12*b* side so as to allow the hinge member 13 and the second housing 12 to relatively rotatably connect each other. Therefore, the second shaft 19 functions as a second fulcrum that relatively rotatably connects the hinge member 13 and the second housing 12. As illustrated in (b) of FIG. 9, a rotation axis P2 of the second shaft 19 (a rotation axis of the second fulcrum) is disposed on the second housing 12 side with respect to the display panel 3 when viewed from an axial direction of the second shaft 19. The rotation axis P2 of the second shaft 19 is parallel to the rotation axis P1 of the first shaft 18, and the axial direction of the second shaft 19 is the same as the axial direction of the first shaft 18. Here, the second housing 12 side particularly refers to the back plate 12*e* side (a so-called "back face side") of the second housing 12.

The third shaft 20 is a third hinge axis, and connects the hinge member 13 and one end portions of the first cover holder member 53 and the second cover holder member 54 so as to allow the hinge member 13, the first cover holder member 53, and the second cover holder member 54 to relatively rotatably connect each other. Specifically, as illustrated in (a) of FIG. 9, the third shaft 20 integrally formed with the second cover holder member 54 is rotatably inserted into a shaft hole 53*f* that faces the second cover holder member 54 in the longitudinal direction of the hinge member 13 and that extends through an end portion of the first cover holder member 53 (specifically, each end portion of the frame portions 53*a* and 53*b* of the first cover holder member 53 on the second housing 12 side) and into the shaft hole 13*c* that faces the second cover holder member 54 through the first cover holder member 53 and that is provided in the end portion of the hinge member 13 (specifically, the first attachment portion 131 and the second attachment portion 132 in the hinge member 13). In this way, the third shaft 20 connects the hinge member 13 and the end portions of the first cover holder member 53 and the second cover holder member 54 on the hinge member 13 side so as to allow the hinge member 13, the first cover holder member 53, and the second cover holder member 54 to relatively rotatably connect each other. Therefore, the third shaft 20 functions as a third fulcrum that relatively rotatably connects the hinge member 13, the first cover holder member 53, and the second cover holder member 54. The first cover glass 51 and the second cover glass 52 rotate in association with the first cover holder member 53 and the second cover holder member 54, respectively. As illustrated in (b) of FIG. 9, a rotation axis P3 of the third shaft 20 (a rotation axis of the third fulcrum) is disposed on the first cover glass 51 side and the second cover glass 52 side (a so-called "display surface side") with respect to the display panel 3 when viewed from an axial direction of the third shaft 20. The rotation axis P3 of the third shaft 20 is parallel to the rotation axis P1 of the first shaft 18, and the axial direction of the third shaft 20 is the same as the axial direction of the first shaft 18.

Therefore, when viewed from the axial direction of the first shaft 18, with respect to the display panel 3, the first shaft 18 and the second shaft 19 are each located on the back face side of the display panel 3, whereas the third shaft 20 is located on the display surface side of the display panel 3. The display surface side is an opposite side to the back face side with respect to the display panel 3.

Note that no such limitation described above is intended, and the first shaft 18 may be integrally formed with or separately formed from the first housing 11 as long as the hinge member 13 and the first housing 11 can be relatively rotatably connected, and the shaft holes of the hinge member 13 and/or the first housing 11 for engaging with the first shaft 18 may each be a through hole or a non-through hole. Similarly, the second shaft 19 may be integrally formed with or separately formed from the second housing 12 as long as the hinge member 13 and the second housing 12 can be relatively rotatably connected, and the shaft holes of the hinge member 13 and/or the second housing 12 for engaging with the second shaft 19 may each be a through hole or a non-through hole. The first shaft 18 and the second shaft 19 connect the first housing 11 and the second housing 12 to each other via the hinge member 13.

Further, no such limitation described above is intended, and the third shaft 20 may be integrally formed with or separately formed from the first cover holder member 53 or the hinge member 13 as long as the hinge member 13, the first cover holder member 53, and the second cover holder member 54 can be relatively rotatably connected, and the shaft holes of the hinge member 13 and/or the second cover holder member 54 for engaging with the third shaft 20 may each be a through hole or a non-through hole. The first cover holder member 53 and the second cover holder member 54 are connected to each other and also to the hinge member 13 by the third shaft 20.

A positional relationship of the shafts 18, 19, and 20 does not change due to an opening/closing operation of the housing unit 2. Thus, as long as the hinge member 13 and the first housing 11 can be relatively rotatably connected, the first shaft 18 (first fulcrum) may be a projection provided on the attachment surface of the first attachment portion 131 and protruding parallel to the longitudinal direction of the hinge member 13 and a projection provided on the attachment surface of the second attachment portion 132 and protruding parallel to the longitudinal direction of the hinge member 13. Similarly, as long as the hinge member 13 and the second housing 12 can be relatively rotatably connected, the second shaft 19 (second fulcrum) may be a projection provided on the attachment surface of the first attachment portion 131 in alignment with the first fulcrum and protruding parallel to the longitudinal direction of the hinge member 13 and a projection provided on the attachment surface of the second attachment portion 132 in alignment with the first fulcrum and protruding parallel to the longitudinal direction of the hinge member 13. Similarly, as long as the hinge member 13, the first cover holder member 53, and the second cover holder member 54 can be relatively rotatably connected, the third shaft 20 (third fulcrum) may be a projection provided on any of the hinge member 13, the first cover holder member 53, and the second cover holder member 54 and protruding parallel to the longitudinal direction of the hinge member 13.

In addition, in order to avoid an overload on the hinge member 13 and the vicinity thereof in a deployed state in which the display device 1 is not folded, the display device 1 is preferably provided with a retention mechanism for preventing the display device 1 (i.e., the housing unit 2) from being deployed at exceeding 180 degrees.

Display Panel

As illustrated in FIG. 1 to FIG. 2, the first housing 11 is provided with the first adhering plate 16 in a flat plate shape to which the display panel 3 is fixed. The second housing 12 is provided with the second adhering plate 17 in a flat plate shape to which the display panel 3 is fixed. In the present embodiment, the first adhering plate 16 and the second adhering plate 17 are fixed to the first housing 11 and the second housing 12 by, for example, an adhesive.

In the display panel 3, one end portion (specifically, an end portion in the longitudinal direction of the display panel 3) is fixed to the first adhering plate 16 by an adhesive, and the other end portion opposite to the one end portion is fixed to the second adhering plate 17 by an adhesive. As a result, the display panel 3 is fixed to the first housing 11 and the second housing 12 at the one end portion and the other end portion so as to extend across the first housing 11 and the second housing 12.

As illustrated in FIG. 2, an adhering portion 133a to which an adhesive is applied is provided in the longitudinal direction of the connecting portion 133 at the center portion of the face of the connecting portion 133 of the hinge member 13 facing the display panel 3. The display panel 3 is fixed only to the first adhering plate 16, the second adhering plate 17, and the adhering portion 133a via adhesive layers using the adhesive, and the display panel 3 is in an unfixed free state in portions other than the first adhering plate 16, the second adhering plate 17, and the adhering portion 133a.

The display panel 3 can be folded by a free portion between the first adhering plate 16 and the adhering portion 133a and a free portion between the second adhering plate 17 and the adhering portion 133a being curved. Thus, as illustrated in FIG. 4, in the first housing 11, the first adhering plate 16 is provided so as to be separated from the connecting portion 133 of the hinge member 13 in a direction parallel to the adhering surface of the first adhering plate 16 and perpendicular to the longitudinal direction of the hinge member 13, and a movable space for the free portion of the display panel 3 is provided between the first adhering plate 16 and the hinge member 13. Similarly, in the second housing 12, the second adhering plate 17 is provided so as to be separated from the connecting portion 133 of the hinge member 13 in a direction parallel to the adhering surface of the second adhering plate 17 and perpendicular to the longitudinal direction of the hinge member 13, and a movable space for the free portion of the display panel 3 is provided between the second adhering plate 17 and the hinge member 13.

The display panel 3 is not fixed to the first cover glass 51 and the second cover glass 52. Thus, the first cover glass 51 and the second cover glass 52 can slide with respect to the display panel 3.

FIG. 10 is a cross-sectional view illustrating an example of a schematic configuration of the display panel 3 according to the present embodiment.

As illustrated in FIG. 10, the display panel 3 has a configuration in which a lower face film 31, a resin layer 32, a barrier layer 33, a drive circuit layer 34, a light-emitting element layer 35, a sealing layer 36, and a touch panel 37 are layered in this order from the lower layer side (the adhesive layer side).

The lower face film 31 is, for example, a PET film for realizing the display device 1 having excellent flexibility by being bonded to the lower face of the resin layer 32 after the support substrate is peeled off. Examples of the material of the resin layer 32 include a polyimide and the like.

The barrier layer 33 is a layer that inhibits foreign matters such as water and oxygen from entering the drive circuit layer 34 and the light-emitting element layer 35, and can be constituted by a silicon oxide film, a silicon nitride film, or a silicon oxynitride film, or by a layered film of these, formed by a CVD method, for example.

The drive circuit layer 34 is, for example, a TFT layer including, for example, a semiconductor film, an inorganic insulating film (gate insulating film) in an upper layer overlying the semiconductor film, a gate electrode and a gate wiring line in an upper layer overlying the inorganic insulating film, an inorganic insulating film in an upper layer overlying the gate electrode and the gate wiring line, a capacitive electrode in an upper layer overlying the inorganic insulating film, an inorganic insulating film in an upper layer overlying the capacitive electrode, a source wiring line in an upper layer overlying the inorganic insulating film, and a flattening film (interlayer insulating film) in an upper layer overlying the source wiring line.

The light-emitting element layer 35 includes an anode in an upper layer overlying the flattening film, an edge cover having insulating properties and covering edges of the anode, an EL (electroluminescent) layer, for example, in an upper layer overlying the edge cover, and a cathode in an upper layer overlying the EL layer. On a subpixel-by-subpixel basis, a light-emitting element (for example, an organic light emitting diode (OLED) or a quantum dot light emitting diode (QLED)) including the island-shaped anode, the EL layer, and the cathode is formed in the light-emitting element layer, and a subpixel circuit that controls the light-emitting element is formed in the drive circuit layer 34.

For example, the EL layer is formed by layering a hole injection layer, a hole transport layer, a light-emitting layer, an electron transport layer, and an electron injection layer in this order, from the lower layer side, as a function layer. Note that a light-emitting element (such as an inorganic light emitting diode) other than the OLED or QLED may be formed in the light-emitting element layer.

The sealing layer 36 is transparent, and includes an inorganic sealing film 36a for covering the cathode, an organic buffer film 36b formed in an upper layer overlying the inorganic sealing film 36a, and an inorganic sealing film 36c formed in an upper layer overlying the organic buffer film 36b. The sealing layer 36 covering the light-emitting element layer 35 inhibits foreign matters such as water and oxygen from penetrating the light-emitting element layer 35.

Each of the inorganic sealing film 36a and the inorganic sealing film 36c is an inorganic insulating film and can be formed of, for example, a silicon oxide film, a silicon nitride film, or a silicon oxynitride film, or a layered film of these, formed by a CVD method. The organic buffer film 36b is a transparent organic film having a flattening effect and can be formed of a coatable organic material such as an acrylic. The organic buffer film 36b can be formed, for example, by ink-jet application, and a bank for stopping droplets may be provided in the frame region (non-display region) around the display region.

A film-type touch panel made of a function film having a touch sensor function is used for the touch panel 37.

Note that the display panel 3 described above is an example of the display panel 3 according to the present embodiment, and the types of the display panel 3 are not particularly limited as long as it is a flexible and foldable display panel.

Touch Operation

As illustrated in FIG. 4 and FIG. 5, the first cover glass 51 and the second cover glass 52 are aligned so as to be on the same plane in a state in which the housing unit 2 is deployed at 180 degrees such that the display panel 3 is deployed at 180 degrees. Similarly, the hinge member 13, the first adhering plate 16, and the second adhering plate 17 are aligned so as to be on the same plane parallel to the first cover glass 51 and the second cover glass 52 in a state in which the housing unit 2 is deployed at 180 degrees such that the display panel 3 is deployed at 180 degrees. Note that, here, a state in which the first cover glass 51 and the second cover glass 52 are aligned on the same plane means that the upper faces (surfaces on a user side) of the first cover glass 51 and the second cover glass 52 are aligned on the same plane. Further, a state in which the hinge member 13, the first adhering plate 16, and the second adhering plate 17 are aligned on the same plane means that, in a state in which the adhesive layer is included, the hinge member 13, the first adhering plate 16, and the second adhering plate 17 are aligned on the same plane.

As illustrated in FIG. 5, the upper face (display surface) of the display panel 3 is covered by the first cover glass 51 and the second cover glass 52. Thus, when a user uses the touch panel 37, i.e., when a user performs a touch operation, the first cover glass 51 or the second cover glass 52 is mechanically directly touched by the user.

Thus, the display panel 3 does not need to withstand a pressing force by the touch operation, and thus the display panel 3 does not get damaged by the pressing force even when the user performs the touch operation on a portion where the display panel 3 is not supported from the lower face side (specifically, a portion located between the first adhering plate 16 and the connecting portion 133 of the hinge member 13 and a portion located between the second adhering plate 17 and the connecting portion 133 of the hinge member 13). Regardless of whether the display panel 3 is supported from the lower face side, the user obtains a sense of a touch from the first cover glass 51 and the second cover glass 52.

The lower faces of the first cover glass 51 and the second cover glass 52 are close to or abut on the display surface of the display panel 3 in a state in which the housing unit 2 is deployed at 180 degrees such that the display panel 3 is deployed at 180 degrees. Thus, when the display device 1 is deployed, the user can operate the touch panel 37 included in the display panel 3 through the first cover glass 51 and the second cover glass 52.

In the present embodiment, the lower faces of the first cover glass 51 and the second cover glass 52 abut on the display surface of the display panel 3 in a state in which the housing unit 2 is deployed at 180 degrees such that the display panel 3 is deployed at 180 degrees. Particularly, in a region where the display panel 3 is supported from the lower face side, i.e., a region corresponding to the first adhering plate 16, the hinge member 13, and the second securing plate 17, the lower faces of the first cover glass 51 and the second cover glass 52 are in close contact with the display surface of the display panel 3 when the display device 1 is deployed.

Therefore, when the display device 1 is deployed, the user can use the touch panel 37 over the entire surface in the display region of the display panel 3. Furthermore, even when the housing unit 2 is in the middle of being bent or open, for example, when the housing unit 2 remains open at 90 degrees or 135 degrees, the touch operation of the display panel 3 is possible when the lower faces of the first cover glass 51 and the second cover glass 52 are close to the display surface of the display panel 3 or are located in such a region.

In addition, the user can perform the touch operation with a stylus pen. In the touch operation with a stylus pen compared to the touch operation with a finger, a load is concentrated in a small area. Thus, a configuration in which a display panel is pressed by a touch operation could not handle an input with a stylus pen. In contrast, the configuration according to the present embodiment can handle an input with a stylus pen since a weight by the touch operation is not applied to the display panel 3.

Note that, in the display device 1, the first cover glass 51 and the second cover glass 52 each relatively rotate by the first shaft 20 along with the first cover holder member 53 and the second cover holder member 54. Thus, there is a so-called rotary relief gap between the first cover glass 51 and the second cover glass 52 in order to avoid contact with each other, but a step due to such a gap is 1 mm or less, and a touch operation is sufficiently possible even on the gap. Further, the user can visually check the gap between the first cover glass 51 and the second cover glass 52, and thus the touch operation is possible while avoiding the gap.

Opening/Closing Operation

According to the display device 1, the opening/closing operation of the housing unit 2 (in other words, the opening/closing operation of the display device 1), the first cover holder member 53 and the first cover glass 51 can be operated in conjunction with the operation of the first housing 11, and the second cover holder member 54 and the second cover glass 52 can be operated in conjunction with the operation of the second housing 12.

Hereinafter, the opening/closing operation of the display device 1 according to the present embodiment will be described with reference to FIG. 11 to FIG. 15.

FIG. 11 to FIG. 15 each are a schematic cross-sectional view illustrating the opening/closing operation of the display device 1 according to the present embodiment. For convenience of illustration, in FIG. 11 to FIG. 15, outlines of the sidewalls 11a, 11b, and 11c, the back plate 11e, the long hole 11g of the first housing 11, and the first adhering plate 16, outlines of the sidewalls 12a, 12b, and 12c, the back plate 12e, the long hole 12g of the second housing 12, and the second adhering plate 17, an outline of the display panel 3, outlines of the first cover glass 51 and the second cover glass 52, outlines of the projections 53e and 54e of the first cover holder member 53 and the second cover holder member 54, and the rotation axes P1, P2, and P3 of the shafts 18, 19, and 20 when viewed from one side (right side in FIG. 2 and FIG. 3) in the longitudinal direction of the hinge member 13 are illustrated, and illustration of other configurations is omitted.

In the following, with reference to FIG. 11 to FIG. 15, description is given with, as an example, the opening/closing operation in which the first housing 11 is rotated 90 degrees with respect to the hinge member 13 from a state in which the display device 1 is deployed at 180 degrees, and then the second housing 12 is rotated 90 degrees with respect to the hinge member 13 to bring the display device 1 into a folded state.

As illustrated in FIG. 11, in a state in which the housing unit 2 is deployed at 180 degrees, the upper faces of the first cover glass 51 and the second cover glass 52 are aligned on the same plane parallel to the display panel 3. Further, the upper faces of the first adhering plate 16 and the second adhering plate 17 are aligned on the other same plane parallel to the display panel 3. Each end portion of the two frame portions 53a and 53b of the first cover holder member 53 on the side farther from the hinge member 13 (i.e., the side on which the projection 53e is provided) is located in a position closest to the rotation axis P1 of the first shaft 18 in a slidable range, and each end portion of the two frame portions 54a and 54b of the second cover holder member 54 on the side farther from the hinge member 13 (i.e., the side on which the projection 54e is provided) is located in a position closest to the rotation axis P2 of the second shaft 19 in a slidable range.

From this state, as illustrated in FIG. 12, when the first housing 11 rotates with respect to the hinge member 13, a position of the second cover glass 52 does not change, but a position of the first cover glass 51 changes. Specifically, the first cover holder member 53 is pressed by the first housing 11 via the projection 53e of the first cover holder member 53 engaged with the long hole 11g of the first housing 11. As a result, the first cover holder member 53 rotates with respect to the hinge member 13, and the projection 53e of the first cover holder member 53 also slides in the long hole 11g of the first housing 11 away from the rotation axis P1 of the first shaft 18. Then, the first cover glass 51 also rotates in conjunction with the rotation of the first cover holder member 53.

Then, as illustrated in FIG. 13, in a stage in which the first housing 11 is bent 90 degrees with respect to the second housing 12, the projection 53e of the first cover holder member 53 reaches a position farthest from the rotation axis P1 of the first shaft 18 within a slidable range of the long hole 11g of the first housing 11. At this time, each end portion of the two frame portions 53a and 53b of the first cover holder member 53 on the side farther from the hinge member 13 is located in a position farthest from the rotation axis P1 of the first shaft 18 in a slidable range, and each end portion of the two frame portions 54a and 54b of the second cover holder member 54 on the side farther from the hinge member 13 is located in the position closest to the rotation axis P2 of the second shaft 19 in a slidable range.

Next, from this state, as illustrated in FIG. 14, when the second housing 12 rotates with respect to the hinge member 13, a position of the first cover glass 51 does not change, but a position of the second cover glass 52 changes. Specifically, the second cover holder member 54 is pressed by the second housing 12 via the projection 54e of the second cover holder member 54 engaged with the long hole 12g of the second housing 12. As a result, the second cover holder member 54 rotates with respect to the hinge member 13, and the projection 54e of the second cover holder member 54 also slides in the long hole 12g of the second housing 12 away from the rotation axis P2 of the second shaft 19. Then, the second cover glass 52 also rotates in conjunction with the rotation of the second cover holder member 54.

Then, as illustrated in FIG. 15, in a stage in which the housing unit 2 is folded and closed such that the first housing 11 and the second housing 12 face each other (i.e., the display panel 3 is in a folded state), the projection 54e of the second cover holder member 54 reaches a position farthest from the rotation axis P2 of the second shaft 19 within a slidable range of the long hole 12g of the second housing 12. At this time, each end portion of the two frame portions 53a and 53b of the first cover holder member 53 on the side farther from the hinge member 13 is located in the position farthest from the rotation axis P1 of the first shaft 18 in a slidable range, and each end portion of the two frame portions 54a and 54b of the second cover holder member 54 on the side farther from the hinge member 13 is located in the position farthest from the rotation axis P2 of the second shaft 19 in a slidable range.

As illustrated in FIG. 11 to FIG. 15, according to the present embodiment, the portion located between the first adhering plate 16 and the connecting portion 133 of the hinge member 13 and the portion located between the second adhering plate 17 and the connecting portion 133 of the hinge member 13 are not supported from the lower face side, and thus the display panel 3 can be bent such that the portions bulge outward to the lower face side. Therefore, the bulge of the bending portion of the display panel 3 can be accommodated in the space enclosed by the first housing 11, the second housing 12, the hinge member 13, the first cover glass 51, and the second cover glass 52.

Therefore, since the first cover glass 51 and the second cover glass 52 operate in conjunction with the operation of the first housing 11 and the second housing 12, the opening/closing operation of the display device 1 is simple. Furthermore, the operating mechanism of the display device 1 for operating the first cover glass 51 and the second cover glass 52 in conjunction with the operation of the first housing 11 and the second housing 12 is also simple.

Note that the entire length of the display panel 3 is not changed by the deflection of the display panel 3 illustrated in FIG. 12 to FIG. 15 from the open state to the closed state of the housing unit 2. In other words, no load of pulling is applied to the display panel 3.

Position of Rotation Axis

Hereinafter, positions of the rotation axes P1, P2, and P3 of the shafts 18, 19, and 20 in the display device 1 according to the present embodiment will be described with reference to FIG. 16.

FIG. 16 is a schematic cross-sectional view illustrating the positions of the rotation axes P1, P2, and P3 of the shafts 18, 19, and 20 in a plane with the axial direction of the first shaft 18 as the normal direction in the display device 1 according to the present embodiment. (a) of FIG. 16 illustrates a state in which the housing unit 2 is deployed at 180 degrees such that the display panel 3 is deployed at 180 degrees, and (b) of FIG. 16 illustrates a state in which the housing unit 2 is folded and closed such that the display panel 3 is in a folded state.

For convenience of illustration, in FIG. 16, outlines of the sidewalls 11a and 11c and the back plate 11e of the first housing 11, outlines of the sidewalls 12a and 12c and the back plate 12e of the second housing 12, outlines of the first cover glass 51 and the second cover glass 52, and the rotation axes P1, P2, and P3 of the shafts 18, 19, and 20 when viewed from one side (right side in FIG. 2) in the longitudinal direction of the hinge member 13 in the portion D surrounded and indicated by the broken lines in FIG. 4 are illustrated, and illustration of other configurations is omitted.

Note that the rotation axes P1, P2, and P3 of the shafts 18, 19, and 20 are parallel to each other. In the present embodiment, the rotation axes P1, P2, and P3 are parallel to the short-hand direction of the first housing 11 and the second housing 12 and parallel to the longitudinal direction of the hinge member 13.

The rotation axis P1 of the first shaft 18 and the rotation axis P2 of the second shaft 19 are disposed symmetrically with respect to the rotation axis P3 of the third shaft 20. Specifically, as illustrated in FIG. 16, the rotation axes P1 and P2 of the first shaft 18 and the second shaft 19 are disposed so as to draw an isosceles triangle in which (i) a first side S1 connecting the rotation axis P1 of the first shaft 18 and the rotation axis P3 of the third shaft 20 and (ii) a second side S2 connecting the rotation axis P2 of the second shaft 19 and the rotation axis P3 of the third shaft 20 are equal in length.

The first cover glass 51 and the second cover glass 52 are also disposed symmetrically with respect to the rotation axis P3 of the third shaft 20. Specifically, even in a state in which the housing unit 2 is open or closed, the rotation axis P3 of the third shaft 20 is disposed on the same plane as the side surface 51a of the first cover glass 51 and on the same plane as the side surface 52a of the second cover glass 52.

Furthermore, the first housing 11 and the second housing 12 are also disposed symmetrically with respect to the rotation axis P3 of the third shaft 20. Specifically, the rotation axis P3 of the third shaft 20 and a center point M of a third side S3 connecting the rotation axis P1 of the first shaft 18 and the rotation axis P2 of the second shaft 19 are disposed on the same plane as the outer face of the sidewall 11a of the first housing 11 and on the same plane as the outer face of the sidewall 12a of the second housing 12 in a state in which the housing unit 2 is open.

In the present embodiment, as illustrated in (b) of FIG. 16, the upper face of the first cover glass 51 and the upper face of the second cover glass 52 face each other and also abut on each other. Thus, as illustrated in (a) and (b) of FIG. 16, even in a state in which the housing unit 2 is open or closed, the rotation axis P3 of the third shaft 20 is located on the same plane as the upper face of the first cover glass 51 and on the same plane as the upper face of the second cover glass 52. Thus, in a state in which the housing unit 2 is open, a distance D1 from the rotation axis P1 of the first shaft 18 to the upper face of the first cover glass 51 and a distance D2 from the rotation axis P2 of the second shaft 19 to the upper face of the second cover glass 52 are equal to a distance D3 from the rotation axis P3 of the third shaft 20 to the center point M of the third side S3 connecting the rotation axis P1 of the first shaft 18 and the rotation axis P2 of the second shaft 19. Similarly, in a state in which the housing unit 2 is closed, a sum of the distance D1 and the distance D2 is equal to a length L of the third side S3. In other words, equations (1) and (2) below hold true.

$$D1 = D2 = D3 \qquad (1)$$

$$D1 + D2 = L \qquad (2)$$

From the equations (1) and (2), L=2×D3 is derived. Therefore, in the present embodiment, the rotation axes P1, P2, and P3 are disposed so as to draw a triangle in which, in a plane with the axial direction of the first shaft 18 as the normal direction, the length L of the third side S3 is twice the distance D3 from the rotation axis P3 of the third shaft 20 to the center point M of the third side S3. The triangle is an isosceles triangle as described above, and is thus an isosceles right triangle.

Further, the side surface 51a of the first cover glass 51 on the hinge member 13 side slides in parallel with the longitudinal direction of the first housing 11 by a distance of D1+D3 from the open state to the closed state of the housing unit 2. Thus, the long hole 11g of the first housing 11 extends such that a distance D4 (see FIG. 6) in which the projection 53e of the first cover holder member 53 can slide in the long hole 11g of the first housing 11 in parallel with the longitudinal direction of the first housing 11 is equal to or more than D1+D3 (D4≧D1+D3). Similarly, the long hole 12g of the second housing 12 extends such that a distance D5 (see FIG. 8) in which the projection 54e of the second cover holder member 54 can slide in the long hole 12g of the second housing 12 in parallel with the longitudinal direction of the second housing 12 is equal to or more than D2+D3 (D5≧D2+D3).

Note that, since the rotation axis P3 of the third shaft 20 is located on the same plane as the upper faces of the first cover glass 51 and the second cover glass 52, the third shaft 20 and the portion of the hinge member 13, the first cover holder member 53, and the second cover holder member 54 connected to the third shaft 20 protrude toward the upper face side farther than the upper faces of the first cover glass 51 and the second cover glass 52 in a state in which the housing unit 2 is open such that the display panel 3 is open at 180 degrees. On the other hand, the hinge portion does not protrude to the lower face side. Thus, in the display device 1 according to the present embodiment, protrusion of the hinge portion is small when being deployed.

Alternatively, although not illustrated, in a folded state in which the display device 1 is folded, the upper face of the first cover glass 51 and the upper face of the second cover glass 52 may be separated from each other on the hinge member 13 side. In this case, L>2×D3, i.e., the rotation axes P1, P2, and P3 are disposed so as to draw a triangle in which, in a plane with the axial direction of the first shaft 18 as the normal direction, the length L of the third side S3 is longer than twice the distance D3 from the rotation axis P3 of the third shaft 20 to the center point M of the third side S3. The triangle is an isosceles triangle as described above, and is thus an obtuse isosceles triangle.

Chamfering

Hereinafter, chamfering of the first housing 11, the second housing 12, the first cover glass 51, and the second cover glass 52 in the display device 1 according to the present embodiment will be described with reference to FIG. 16.

During the opening/closing operation of the display device 1, the display panel 3 is susceptible to an collision and friction with a lower face side corner portion (first corner portion) with the side surfaces 51a and 52a of the first cover glass 51 and the second cover glass 52 as lower faces. In order to reduce such a collision and friction, the corner portion is R-chamfered.

As described above, there is the rotary relief gap between the first cover glass 51 and the second cover glass 52. For such a rotary relief gap, an upper face side corner portion (second corner portion) with the side surfaces 51a and 52a of the first cover glass 51 and the second cover glass 52 on the hinge member 13 side as upper faces is R-chamfered. An R value (i.e., a radius of curvature of R-chamfering) R1 of the upper side corner portion is preferably smaller than an R value R2 of the lower face side corner portion.

Second Embodiment

A description follows regarding differences from the first embodiment in the present embodiment.

FIG. 17 is a schematic side view illustrating positions of rotation axes P1, P2, and P3 of shafts 18, 19, and 20 in a plane with an axial direction of the first shaft 18 as the normal direction in a display device 1 according to the present embodiment.

For convenience of illustration, in FIG. 17, an outline of a function film 55, outlines of sidewalls 11a and 11c and a back plate 11e of a first housing 11, outlines of sidewalls 12a and 12c and a back plate 12e of a second housing 12, outlines of a first cover glass 51 and a second cover glass 52, and the rotation axes P1, P2, and P3 of the shafts 18, 19, and 20 when viewed from one side (right side in FIG. 2) in the longitudinal direction of a hinge member 13 are illustrated, and illustration of other configurations is omitted.

As illustrated in FIG. 17, the display device 1 according to the present embodiment includes one function film 55 bonded to upper faces of the first cover glass 51 and the second cover glass 52. By adhesion in this manner, foreign matters such as dust can be prevented from entering a housing unit 2 from between the first cover glass 51 and the second cover glass 52. The function film 55 is, for example, an anti-failure film, an anti-reflection film, and the like.

The function film 55 (i) includes a first portion bonded to the upper face of the first cover glass 51 and a second portion bonded to the upper face of the second cover glass 52, (ii) has transparency and flexibility, and (iii) is folded such that upper faces of the first portion and the second portion face each other in a folded state in which the display device 1 is folded. Further, the function film 55 is bonded such that at least a part of the function film 55 overlaps a display region of the display panel 3 in a state in which the housing unit 2 is open such that the display panel 3 is open at 180 degrees.

In the present embodiment, as illustrated in FIG. 17, since the function film 55 is bonded, the upper faces of the first portion and the second portion of the function film 55 abut on each other instead of the upper faces of the first cover glass 51 and the second cover glass 52 abutting on each other. The function film 55 is bent about the center surface 55a while maintaining dimensions of a center surface 55a (center surface in a thickness direction) between the upper face and a lower face. Thus, in a state in which the housing unit 2 is open such that the display panel 3 is open at 180 degrees, the rotation axis P3 of the third shaft 20 is disposed so as to be located on the center surface 55a of the function film 55. On the other hand, in a state in which the housing unit 2 is folded and closed such that the display panel 3 is folded, the rotation axis P3 of the third shaft 20 may deviate from the center surface 55a of the function film 55 due to a thickness of the function film 55. Since the function film 55 is thin, this deviation is small enough to be negligible. Thus, even in a state in which the housing unit 2 is folded and closed, the rotation axis P3 of the third shaft 20 can be regarded as being located on the center surface 55a of the function film 55.

Thus, similarly to the first embodiment described above, for a distance D1' from the rotation axis P1 of the first shaft 18 to the center surface 55a of the function film 55, a distance D2' from the rotation axis P2 of the second shaft 19 to the center surface 55a of the function film 55, a distance D3 from the rotation axis P3 of the third shaft 20 to a center point M of a third side S3 connecting the rotation axis P1 of the first shaft 18 and the rotation axis P2 of the second shaft 19, and a length L of the third side S3, equations (1)' and (2)' below hold true.

$$D1' = D2' = D3 \quad (1)'$$

$$D1' + D2' = L \quad (2)'$$

Therefore, also in the present embodiment, the rotation axes P1, P2, and P3 are disposed so as to draw an isosceles right triangle of L=2×D3. Alternatively, although not illustrated, the rotation axes P1, P2, and P3 may be disposed so as to draw an obtuse isosceles triangle of L>2×D3.

Third Embodiment

A description follows regarding differences from the first and second embodiments in the present embodiment.

(a) of FIG. 18 is a plan view illustrating a schematic configuration of a display device 1 according to the present embodiment, and (b) of FIG. 18 is a cross-sectional view of a housing unit 2 illustrated in (a) of FIG. 18 taken along line B-B' in a direction of arrows. (a) of FIG. 19 is an enlarged cross-sectional view of main portions illustrating a portion F surrounded and indicated by broken lines in (b) of FIG. 18, and (b) of FIG. 19 is an enlarged cross-sectional view of main portions illustrating a portion G surrounded and indicated by broken lines in (b) of FIG. 18.

As illustrated in FIG. 18 and FIG. 19, the display device 1 according to the present embodiment includes a first flange portion 56 provided in a first housing 11, and a second flange portion 57 provided in a second housing 12. The first flange portion 56 and the second flange portion 57 may each be formed of the same material as the first housing 11 and the second housing 12.

As illustrated in (b) of FIG. 18 and (a) of FIG. 19, a side surface 51b of a first cover glass 51 on a side farther from a hinge member 13 is accommodated on a lower face side of the first flange portion 56 in a state in which the housing unit 2 is open such that a display panel 3 is open at 180 degrees. At this time, in a plan view when viewed from a direction perpendicular to a display surface of the display panel 3, in a state in which the housing unit 2 is open, an end portion of the first cover glass 51 on the side farther from the hinge member 13 overlaps the first flange portion 56. In this way, foreign matters such as dust can be prevented from entering the first housing 11 from a gap between the first housing 11 and the first cover glass 51. Furthermore, in a plan view, in a state in which the housing unit 2 is open, an end portion of a first cover holder member 53 on the side farther from the hinge member 13 also overlaps the first flange portion 56.

Similarly, as illustrated in (b) of FIG. 18 and (b) of FIG. 19, a side surface 52b of the second cover glass 52 on a side farther from the hinge member 13 is accommodated on a lower face side of the second flange portion 57 in a state in which the housing unit 2 is open such that the display panel 3 is open at 180 degrees. At this time, in a plan view when viewed from a direction perpendicular to the display surface of the display panel 3, in a state in which the housing unit 2 is open, an end portion of the second cover glass 52 on the side farther from the hinge member 13 overlaps the second flange 57 portion. In this way, foreign matters such as dust can be prevented from entering the second housing 12 from a gap between the second housing 12 and the second cover glass 52. Furthermore, in a plan view, in a state in which the housing unit 2 is open, an end portion of a second cover holder member 54 on the side farther from the hinge member 13 also overlaps the second flange 57 portion.

Fourth Embodiment

A description follows regarding differences from the first, second, and third embodiments in the present embodiment.

(a) of FIG. 20 is a plan view illustrating a schematic configuration of a housing unit 2 according to the present embodiment, and (b) of FIG. 20 is a perspective view illustrating a state in which a first cover glass 51, a second cover glass 52, a first cover holder member 53, a second cover holder member 54, and a second adhering plate 17 are removed from the housing unit 2 illustrated in (a) of FIG. 20. (a) of FIG. 21 is a cross-sectional view of the housing unit 2 illustrated in (a) of FIG. 20 taken along line B-B' in a direction of arrows, and (b) of FIG. 21 is a cross-sectional view of the housing unit 2 illustrated in (a) of FIG. 20 taken along line C-C' in a direction of arrows.

Figure 21:
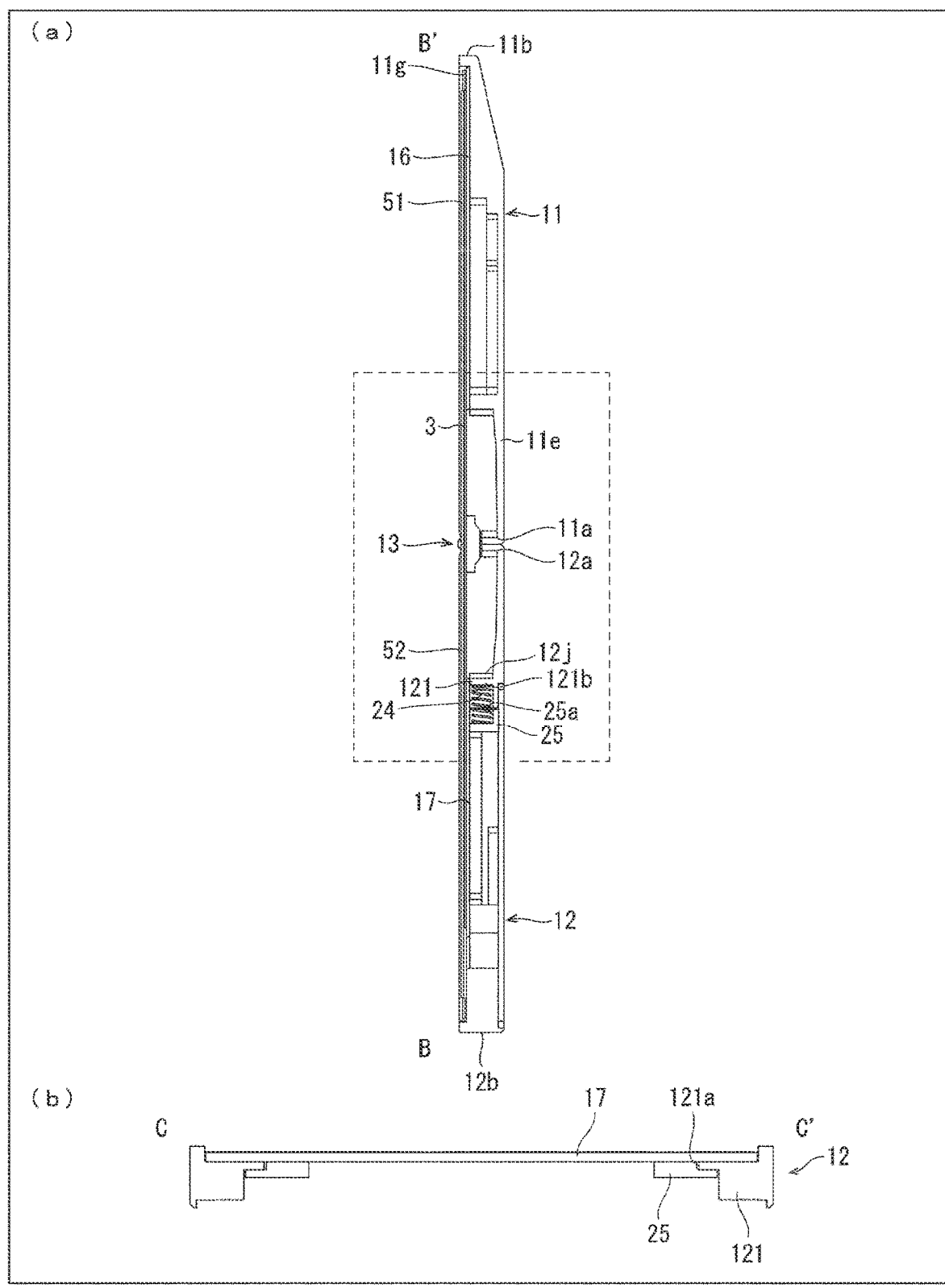

As illustrated in (b) of FIG. 20 and (a) of FIG. 21, a display device 1 according to the present embodiment includes a spring 24, for example, as an elastic member, in a portion within the housing unit 2 that is not visible from the outside of the display device 1, specifically, between a rear face of the second adhering plate 17 (in other words, a face of the second adhering plate 17 on an opposite side to an adhering surface of a display panel 3) and a face 12k of a second housing 12 facing the rear face of the second adhering plate 17.

A spring holder member 25 that holds the spring 24 is attached to the rear face of the second adhering plate 17. The spring holder member 25 is bonded to the second adhering plate 17 by, for example, an adhesive.

As illustrated in (b) of FIG. 20 and (a) and (b) of FIG. 21, the second housing 12 is provided with, for example, a frame-shaped wall body 121 having a groove portion 121a surrounding the spring holder member 25.

The spring 24 is disposed so as to expand and contract in a direction parallel to the adhering surface of the display panel 3 and perpendicular to the axis about which the housing unit 2 is folded, in the second adhering plate 17. A spring receiving portion 25a that comes into contact with one end portion of the spring 24 in the expanding/contracting direction is provided on a face of the spring holder member 25 facing the wall body 121 in a direction perpendicular to the axis about which the housing unit 2 is folded.

A spring receiving portion 121b that comes into contact with the other end portion in the expanding/contracting direction of the spring 24 is provided on a face of the wall body 121 facing the spring receiving portion 25a in a direction perpendicular to the axis about which the housing unit 2 is folded, so as to sandwich the spring 24 between the spring receiving portion 121b and the spring receiving portion 25a. Note that here the direction perpendicular to the axis about which the housing unit 2 is folded refers to a direction perpendicular to an axial direction of shafts 18 to 20 (in other words, a longitudinal direction of a hinge member 13).

In (b) of FIG. 20 and (a) of FIG. 21, a case is illustrated as an example in which the spring receiving portion 25a is provided in a central portion of one end portion of the hinge member 13 side of both end portions of the spring holder member 25 which are parallel to the longitudinal direction of the hinge member 13, and the spring receiving portion 121b is provided in a center portion of a face facing the spring receiving portion 25a of one end portion on the hinge member 13 side of both end portions of the wall body 121 which are parallel to the longitudinal direction of the hinge member 13.

However, the present embodiment is not limited thereto, and the spring receiving portion 25a may be provided on the other end portion of the spring holder member 25 that is parallel to the longitudinal direction of the hinge member 13 (that is, in (b) of FIG. 20, an end portion that faces the end portion where the spring receiving portion 25a is provided with the groove portion 121a therebetween). The number of spring receiving portions 25a and the contact area of the spring 24 in the spring receiving portion 25a are not particularly limited. In (b) of FIG. 20 and (a) of FIG. 21, a case is illustrated as an example in which the spring 24 is a compression coil spring, but the type of the spring 24 is not particularly limited.

The spring 24 is provided in compression on the hinge member 13 side such that the display panel 3 is open at 180 degrees without deflection in a state in which the housing unit 2 is deployed at 180 degrees. Specifically, in a state in which the housing unit 2 is deployed at 180 degrees, first, one end of the display panel 3 is attached to a first adhering plate 16, and then in a state in which the spring 24 is compressed such that the second adhering plate 17 is located closest to the hinge member 13 within a slidable range, the other end of the display panel 3 on the opposite side to the one end described above is attached to the second adhering plate 17. For this reason, in a state in which the housing unit 2 is deployed at 180 degrees, the display panel 3 is provided with a tight tension between the first adhering plate 16 and the second adhering plate 17 so as to compress the spring 24, and the second adhering plate 17 on the movable side is pulled toward the first adhering plate 16 on the fixed side by the display panel 3 together with the spring 24. Thus, the spring 24 has tension in a direction that moves the second adhering plate 17 away from the hinge member 13.

The width of the groove portion 121a in the direction perpendicular to the axis about which the housing unit 2 is folded is formed larger than the width of the spring holder member 25 in the same direction.

In a state in which the housing unit 2 is deployed at 180 degrees, a gap is provided between a face facing the spring holder member 25 at an end portion on the opposite side to the hinge member 13 of both end portions of the wall body 121 that are parallel to the longitudinal direction of the hinge member 13, and a face facing the wall body 121 at an end portion on the opposite side to the hinge member 13 of both end portions of the spring holder member 25 that are parallel to the longitudinal direction of the hinge member 13. Note that the gap is covered by the second adhering plate 17 in a plan view in a state in which the housing unit 2 is deployed at 180 degrees.

The spring holder member 25 is movable along the second housing 12 in a direction parallel to the adhering surface of the display panel 3 and perpendicular to the axis about which the housing unit 2 is folded in the second adhering plate 17, in the gap, by the expansion/contraction of the spring 24. Thus, the second adhering plate 17 is movable along the second housing 12 in a direction parallel to the adhering surface of the display panel 3 and perpendicular to the axis about which the housing unit 2 is folded, in the second adhering plate 17, by the expansion/contraction of the spring 24. Note that in the present embodiment, the first adhering plate 16 is fixed to a first housing 11.

As illustrated in (b) of FIG. 21, the spring holder member 25 is provided in contact with the wall body 121 of the second housing 12 at an end portion that is parallel to a direction perpendicular to the axis about which the housing unit 2 is folded. The spring holder member 25 slides smoothly with the wall body 121. The wall body 121 may be provided with a guide member that guides the spring holder member 25 in the direction perpendicular to the axis about which the housing unit 2 is folded, or may be provided with a slider that slides the spring holder member 25 in the direction perpendicular to the axis about which the housing unit 2 is folded.

Note that in the present embodiment, as described above, the spring holder member 25 is fixed to the second adhering plate 17 such that the second adhering plate 17 moves integrally with respect to the second housing 12, but the second adhering plate 17 and the spring holder member 25 may be integrally formed. In other words, the spring holder member 25 may be movable with respect to the second housing 12 by the second adhering plate 17 being integrated with the spring holder member 25 and the spring holder member 25 serving as the second adhering plate 17.

Next, effects of the display device 1 according to the present embodiment will be described below with reference to FIG. 22 to FIG. 24.

FIG. 22 is a cross-sectional view of main portions illustrating a relationship between a length of the display panel 3 and a length of a face L1 that passes over the shafts 18 and 19 and is parallel to the first housing 11 and the second housing 12 in a state in which the housing unit 2 is deployed at 180 degrees. (a) of FIG. 23 is a cross-sectional view of main portions illustrating a relationship between a length of an adhering surface 3' of the display panel 3 and a length of the face L1 that passes over the shafts 18 and 19 and is parallel to the first housing 11 and the second housing 12 when the housing unit 2 is started to be folded, and (b) of FIG. 23 is a cross-sectional view of main portions illustrating a relationship between a length of the display panel 3 and a length of the face L1 that passes over the shafts 18 and 19 and is parallel to the first housing 11 and the second housing 12 when the housing unit 2 is started to be folded in a state in which the first adhering plate 16 and the second adhering plate 17 are fixed to the corresponding first housing 11 and the corresponding second housing 12, respectively. FIG. 24 is a cross-sectional view of main portions illustrating a relationship between a length of the display panel 3 and a length of the face L1 that passes over the shafts 18 and 19 and is parallel to the first housing 11 and the second housing 12 when the housing unit 2 is started to be folded in the display device 1 according to the present embodiment.

Figure 23:
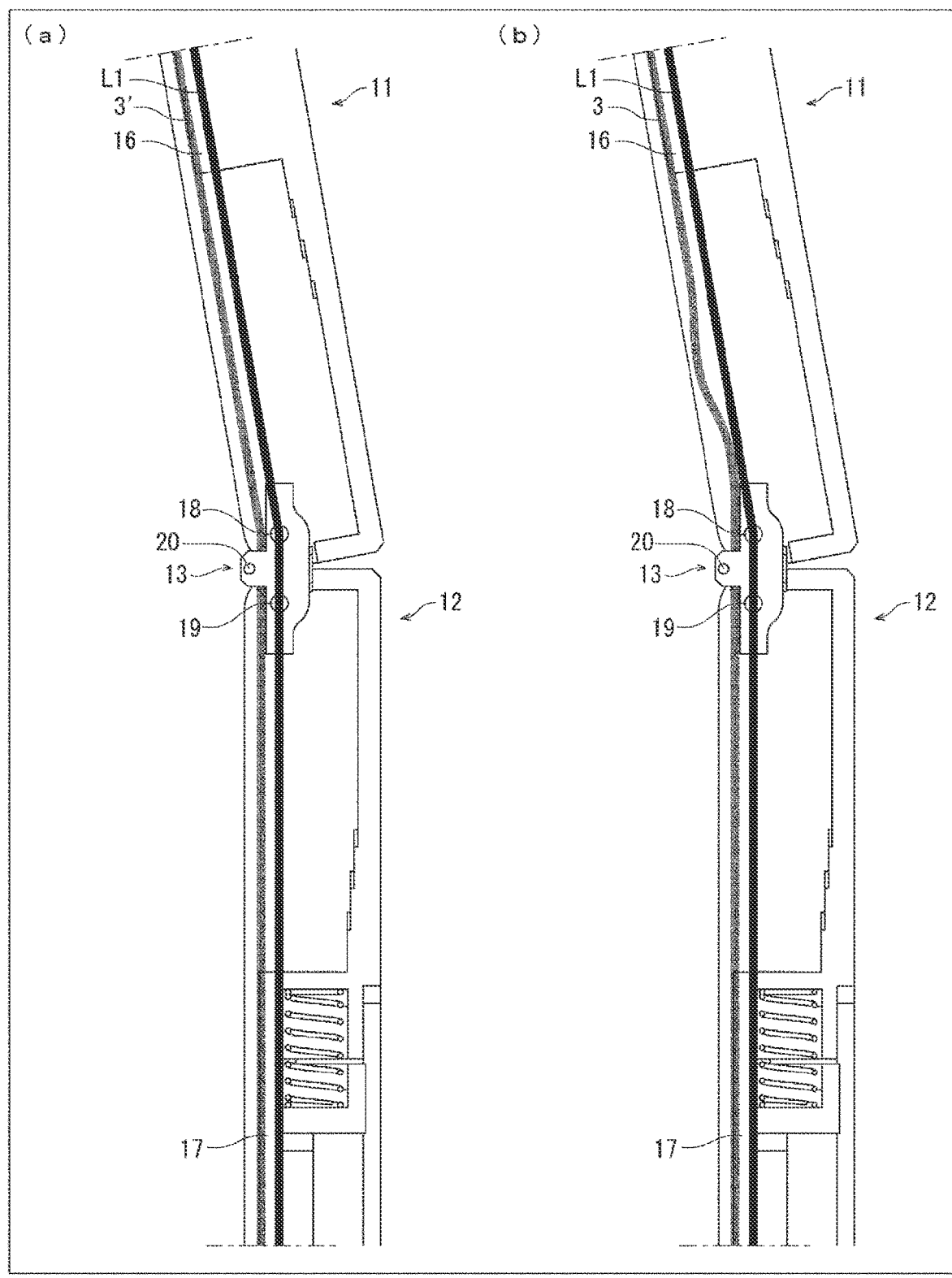

Note that all of FIG. 22 to FIG. 24 are enlarged cross-sectional views of main portions illustrating the portion surrounded and indicated by broken lines in (a) of FIG. 21, and all of the length of the display panel 3, the length of the adhering surface of the display panel 3, and the length of the face L1 between dot-dash lines illustrated in FIG. 22 to FIG. 24 correspond to the length of the display panel 3, the length of the adhering surface of the display panel 3, and the length of the face L1 of the portion which is surrounded and indicated by the broken lines in (a) of FIG. 21. Note that the face L1 is a virtual face, and the length of the face L1 is a virtual length of the face L1.

In a state in which the housing unit 2 is deployed at 180 degrees, the length of the display panel 3 between the dot-dash lines illustrated in FIG. 22 and the length of the face L1 are the same. In this way, in a state in which the housing unit 2 is deployed at 180 degrees, the length of the adhering surface 3' of the display panel 3 in the housing unit 2 and the length of the actual display panel 3 are the same.

Meanwhile, in a state in which the housing unit 2 is folded, the hinge member 13 is disposed further outward than the display panel 3. In other words, in a state in which the housing unit 2 is folded, the face L1 that passes over the shafts 18 and 19 and is parallel to the first housing 11 and the second housing 12 is disposed further outward than the adhering surface 3' of the display panel 3. Therefore, when the housing unit 2 is started to be folded from a state in which the housing unit 2 is deployed at 180 degrees, the length of the adhering surface 3' of the display panel 3 between dot-dash lines illustrated in (a) of FIG. 23 becomes shorter than the length of the face L1. Thus, in a case where the first adhering plate 16 and the second adhering plate 17 are fixed to the corresponding first housing 11 and second housing 12, respectively, when the housing unit 2 is started to be folded from a state in which the housing unit 2 is deployed at 180 degrees, the display panel 3 becomes longer than the adhering surface 3' of the display panel 3 between the first adhering plate 16 and the second adhering plate 17, and the display panel 3 includes an excess with respect to the adhering surface 3' of the display panel 3, and a deflection occurs in the display panel 3, as illustrated in (b) of FIG. 23. Note that the length of the display panel 3 between the dot-dash lines illustrated in (b) of FIG. 23 and the length of the face L1 are the same length as the display panel 3 flexes.

However, according to the present embodiment, as described above, the spring 24 is pulled by the display panel 3 in a state in which the housing unit 2 is deployed at 180 degrees and is provided in compression on the hinge member 13 side, and has tension in a direction that moves the second adhering plate 17 away from the hinge member 13 (elastic force, that is, a force that tries to return to the original position).

As a result, when the housing unit 2 is started to be folded from a state in which the housing unit 2 is deployed at 180 degrees, the tension applied to the display panel 3 is weakened, and the tension applied to the spring 24 is weakened by beginning to flex from a tight state. As a result, the spring 24 extends in a direction that moves the second adhering plate 17 away from the hinge member 13. As a result, by the spring holder member 25 being pressed in the downward direction in FIG. 24 (in other words, in the direction of the sidewall 12a in the second housing 12) by the spring 24, the spring holder member 25 moves along the second housing 12 in a direction that moves the second adhering plate 17 away from the hinge member 13 together with the second adhering plate 17. At this time, an elastic force is exerted by the spring 24 between the second adhering plate 17 and the second housing 12. At this time, by the spring holder member 25 moving within the groove portion 121a of the wall body 121, the wall body 121 functions as a regulating member that regulates the range of movement of the second adhering plate 17 and the spring holder member 25.

As illustrated in FIG. 22, in a state in which the housing unit 2 is deployed at 180 degrees, the spring 24 is compressed to a length n in a direction perpendicular to the axis about which the housing unit 2 is folded. From this state, as illustrated in FIG. 24, when the second adhering plate 17 and the spring holder member 25 are moved by a distance g1 in the direction perpendicular to the axis about which the housing unit 2 is folded so as to move the second adhering plate 17 away from the hinge member 13, the spring 24 extends between the spring receiving portion 25a and the spring receiving portion 121b such that the length in the direction perpendicular to the axis about which the housing unit 2 is folded is n+g1.

In this way, by the display panel 3 extending in the downward direction illustrated in FIG. 24 along the second housing 12, the deflection of the display panel 3 is eliminated. The display panel 3 is attached to the first adhering plate 16 and the second adhering plate 17, and the spring 24 presses down the second adhering plate 17 in the downward direction in FIG. 24 by the deflection of the display panel 3 between the first adhering plate 16 and the second adhering plate 17. Thus, the distance g1 corresponds to the length of the deflection of the display panel 3. That is, in the present embodiment, in a state in which the housing unit 2 is folded as illustrated in FIG. 24, by the display panel 3 extending by the length of the deflection in the downward direction in FIG. 24 (the length corresponding to the distance g1), the length of the face L1 between dot-dash lines illustrated in FIG. 24 and the length of the display panel 3 extending in the downward direction in FIG. 24 by the distance g1 illustrated in FIG. 24 (the length of the display panel 3 between the dot-dash line on the upper end side and the chain double-dashed line on the lower end side in FIG. 24) are the same.

According to the present embodiment, in this way, the second adhering plate 17 is movable along the second housing 12 in a direction parallel to the adhering surface of the display panel 3 and perpendicular to the axis about which the housing unit 2 is folded, and when the housing unit 2 is folded, by moving the second adhering plate 17 in the direction away from the hinge member 13, the display panel 3 attached to the second adhering plate 17 is pulled in the direction of movement of the second adhering plate 17, and a deflection as illustrated in (b) of FIG. 23 does not occur.

When the housing unit 2 is going to be opened from a state in which the housing unit 2 is folded and closed such that the display panel 3 is in the folded state, by the second adhering plate 17 being pulled with the display panel 3 attached to the first adhering plate 16 and moved toward the hinge member 13 side (in other words, the direction in which the second adhering plate 17 is moved closer to the hinge member 13), the spring 24 is compressed again.

According to the present embodiment, when the housing unit 2 is folded, by moving the second adhering plate 17 in the direction away from the hinge member 13, the display panel 3 attached to the second adhering plate 17 is pulled in the direction of movement of the second adhering plate 17, and a deflection on the display panel 3 does not occur. Thus, according to the present embodiment, a touch operation on the display panel 3 is sufficiently possible even in the middle of being folded.

Supplement

A display device according to a first aspect of the disclosure includes: a housing unit being foldable; and a display panel with flexibility, wherein the display panel includes a first display region, and a second display region adjacent to the first display region, the housing unit includes a hinge member, a first housing and a second housing connected to each other via the hinge member, a first cover holder member and a second cover holder member connected to each other and connected to the hinge member, a first cover member held by the first cover holder member, and covering a display surface of the display panel in the first display region, a second cover member held by the second cover holder member, and covering a display surface of the display panel in the second display region, a first fulcrum connecting the hinge member and an end portion of the first housing in a manner of being relatively rotatable between the hinge member and the first housing, a second fulcrum connecting the hinge member and an end portion of the second housing in a manner of being relatively rotatable between the hinge member and the second housing, and a third fulcrum connecting the hinge member, a first end portion of the first cover holder member, and a first end portion of the second cover holder member in a manner of being relatively rotatable between the hinge member, the first cover holder member, and the second cover holder member, the display panel is disposed between (i) the first housing and the second housing and (ii) the first cover member and the second cover member, a second end portion on an opposite side to the first end portion of the first cover holder member is slidably connected to the first housing, and a second end portion on an opposite side to the first end portion of the second cover holder member is slidably connected to the second housing.

A display device according to a second aspect of the disclosure is the display device according to the first aspect, wherein the first fulcrum and the second fulcrum may be disposed on a back face side of the display panel when viewed from an axial direction of the first fulcrum, and the third fulcrum may be disposed on a display surface side of the display panel on an opposite side to the back face side with respect to the display panel when viewed from the axial direction of the first fulcrum.

A display device according to a third aspect of the disclosure is the display device according to the first or second aspect, wherein, in a plane with an axial direction of the first fulcrum as a normal direction, the first fulcrum, the second fulcrum, and the third fulcrum may be disposed to draw an isosceles triangle in which (i) a first side connecting a rotation axis of the first fulcrum and a rotation axis of the third fulcrum and (ii) a second side connecting a rotation axis of the second fulcrum and the rotation axis of the third fulcrum are equal in length.

A display device according to a fourth aspect of the disclosure is the display device according to any one of the first to third aspects, wherein, in a plane with an axial direction of the first fulcrum as the normal direction, the first fulcrum, the second fulcrum, and the third fulcrum may be disposed to draw a triangle in which a length of a third side connecting the rotation axis of the first fulcrum and the rotation axis of the second fulcrum is twice a distance from the rotation axis of the third fulcrum to a center point of the third side.

A display device according to a fifth aspect of the disclosure is the display device according to any one of the first to third aspects, wherein, in a plane with an axial direction of the first fulcrum as the normal direction, the first fulcrum, the second fulcrum, and the third fulcrum may be disposed to draw a triangle in which a length of a third side connecting the rotation axis of the first fulcrum and the rotation axis of the second fulcrum is longer than twice a distance from the rotation axis of the third fulcrum to a center point of the third side.

A display device according to a sixth aspect of the disclosure is the display device according to any one of the first to fifth aspects, wherein the first cover member and the second cover member may each include a first main surface facing the display panel, and a second main surface on an opposite side to the first main surface, and the rotation axis of the third fulcrum may be located on a same plane as the second main surface of the first cover member and located on a same plane as the second main surface of the second cover member in a state in which the housing unit is open to allow the display panel to be open at 180 degrees.

A display device according to a seventh aspect of the disclosure is the display device according to any one of the first to fifth aspects further includes one function film, wherein the first cover member and the second cover member may each include a first main surface facing the display panel, and a second main surface on an opposite side to the first main surface, the function film may include a first portion bonded to the second main surface of the first cover member, and a second portion bonded to the second main surface of the second cover member, and the function film may overlap the display region of the display panel in a state in which the housing unit is open to allow the display panel to be open at 180 degrees.

A display device according to an eighth aspect of the disclosure is the display device according to the seventh aspect, wherein the rotation axis of the third fulcrum may be located on a center surface of the function film in a thickness direction in a state in which the housing unit is open to allow the display panel to be open at 180 degrees.

A display device according to a ninth aspect of the disclosure is the display device according to the sixth or eighth aspect, wherein the first cover member and the second cover member may each further include a side surface perpendicular to the second main surface, the side surface of the first cover member may face the side surface of the second cover member in a state in which the housing unit is open to allow the display panel to be open at 180 degrees, and the rotation axis of the third fulcrum may be located on a same plane as the side surface of the first cover member and located on a same plane as the side surface of the second cover member.

A display device according to a tenth aspect of the disclosure is the display device according to any one of the first to ninth aspects, wherein, in each of the first cover member and the second cover member, a first corner portion formed between the first main surface facing the display panel and a side surface on the hinge member side may be R-chamfered.

A display device according to an eleventh aspect of the disclosure is the display device according to the tenth aspect, wherein, in each of the first cover member and the second cover member, a second corner portion formed between the second main surface on the opposite side to the first main surface and the side surface may be R-chamfered.

A display device according to a twelfth aspect of the disclosure is the display device according to the eleventh aspect, wherein an R value of R-chamfering of the first corner portion may be greater than an R value of R-chamfering of the second corner portion.

A display device according to a thirteenth aspect of the disclosure is the display device according to any one of the first to twelfth aspects, wherein the hinge member may include a first attachment portion connected to a first side portion on one side of the end portion of the first housing and the second housing, a second attachment portion connected to a second side portion on another side being an opposite side to the one side of the end portion of the first housing and the second housing, and a connecting portion connected between the first attachment portion and the second attachment portion, and having a planar surface facing the display panel, and the display panel may abut on the connecting portion in a state in which the housing unit is folded and closed to allow the display panel to be in a folded state.

A display device according to a fourteenth aspect of the disclosure is the display device according to any one of the first to thirteenth aspects, wherein the first housing may include a first flange portion, the second end portion of the first cover holder member may overlap the first flange portion in a state in which the housing unit is open to allow the display panel to be open at 180 degrees, the second housing may include a second flange portion, and the second end portion of the second cover holder member may overlap the second flange portion in a state in which the housing unit is open to allow the display panel to be open at 180 degrees.

A display device according to a fifteenth aspect of the disclosure is the display device according to the fourteenth aspect, wherein an end portion of the first cover member may overlap the first flange portion in a state in which the housing unit is open to allow the display panel to be open at 180 degrees, and an end portion of the second cover member may overlap the second flange portion in a state in which the housing unit is open to allow the display panel to be open at 180 degrees.

A display device according to a sixteenth aspect of the disclosure is the display device according to any one of the first to fifteenth aspects, wherein at least one of the first cover member and the second cover member may be slidable with respect to the display panel.

A display device according to a seventeenth aspect of the disclosure is the display device according to the sixteenth aspect, wherein one of the second end portion of the first cover holder member and the first housing may be provided with a projection, and the other of the second end portion of the first cover holder member and the first housing may be provided with a long hole slidably engaged with the projection.

A display device according to an eighteenth aspect of the disclosure is the display device according to the seventeenth aspect, wherein, in a state in which the housing unit is folded and closed to allow the display panel to be in a folded state, the second end portion of the first cover holder member may be located in a position farthest from the rotation axis of the first fulcrum within a slidable range.

A display device according to a nineteenth aspect of the disclosure is the display device according to the seventeenth or eighteenth aspect, wherein, in a state in which the housing unit is open to allow the display panel to be open at 180 degrees, the second end portion of the first cover holder member may be located in a position closest to the rotation axis of the first fulcrum within a slidable range.

A display device according to a twentieth aspect of the disclosure is the display device according to the first to nineteenth aspects, wherein a first end portion of the display panel may be fixed to the first housing, and a second end portion on an opposite side to the first end portion of the display panel may be fixed to the second housing.

A display device according to a twenty-first aspect of the disclosure is the display device according to the twentieth aspect, wherein the first end portion of the display panel may be slidably fixed to the first housing, or the second end portion of the display panel may be slidably fixed to the second housing.

A display device according to a twenty-second aspect of the disclosure is the display device according to the twenty-first aspect, wherein the first housing may include a first adhering plate, and the first end portion of the display panel may be fixed to the first housing via the first adhering plate.

A display device according to a twenty-third aspect of the disclosure is the display device according to the twenty-first aspect, wherein the second housing may include a second adhering plate, and the second end portion of the display panel may be fixed to the second housing via the second adhering plate.

A display device according to a twenty-fourth aspect of the disclosure is the display device according to the twentieth aspect, wherein the first housing may be provided with a first adhering plate to which the first end portion of the display panel is fixed, and the second housing may be provided with a second adhering plate in a flat plate shape to which the second end portion of the display panel is fixed.

A display device according to a twenty-fifth aspect of the disclosure is the display device according to the twenty-fourth aspect, wherein the second adhering plate may be formed to be slidable along the second housing in a direction parallel to an adhering surface of the display panel in the second adhering plate and perpendicular to an axis about which the housing unit is folded.

A display device according to a twenty-sixth aspect of the disclosure is the display device according to the twenty-fifth aspect, wherein the housing unit may further include an elastic member disposed to expand and contract in a direction parallel to the adhering surface of the display panel in the second adhering plate and perpendicular to the axis about which the housing unit is folded, between a face of the second adhering plate on an opposite side to the adhering surface of the display panel and a face of the second housing facing the face on the opposite side.

A display device according to a twenty-seventh aspect of the disclosure is the display device according to the twenty-sixth aspect, wherein the elastic member may include tension in a direction that moves the second adhering plate away from the hinge member.

A display device according to a twenty-eighth aspect of the disclosure is the display device according to any one of the first to twenty-seventh aspects, wherein, in a state in which the housing unit is folded and closed to allow the display panel to be in a folded state, the housing unit may form a space enclosed by the hinge member, the first housing, the second housing, the first cover member, and the second cover member to accommodate a bulge of a bending portion of the display panel.

A display device according to a twenty-ninth aspect of the disclosure is the display device according to any one of the first to twenty-eighth aspects, wherein the display panel may include a touch panel.

A display device according to a thirtieth aspect of the disclosure is the display device according to any one of the first to twenty-ninth aspects, wherein the first cover member and the second cover member may each include a cover glass.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:
1. A display device comprising:
a housing unit being foldable; and
a display panel with flexibility,
wherein the display panel includes a first display region and a second display region adjacent to the first display region,
the housing unit includes:
one hinge member,
a first housing and a second housing connected to each other via the one hinge member,
a first cover holder member and a second cover holder member connected to each other and connected to the one hinge member, a first cover member held by the first cover holder member, and covering a display surface of the display panel in the first display region, a second cover member held by the second cover holder member, and covering a display surface of the display panel in the second display region, a first fulcrum connecting the one hinge member and an end portion of the first housing in a manner of being relatively rotatable between the one hinge member and the first housing, a second fulcrum connecting the one hinge member and an end portion of the second housing in a manner of being relatively rotatable between the one hinge member and the second housing, and a third fulcrum connecting the one hinge member, a first end portion of the first cover holder member, and a first end portion of the second cover holder member in a manner of being relatively rotatable between the one hinge member, the first cover holder member, and the second cover holder member, a second end portion on an opposite side of the first end portion of the first cover holder member is slidably connected to the first housing, a second end portion on an opposite side of the first end portion of the second cover holder member is slidably connected to the second housing, and the one hinge member is connected to each of the first housing, the second housing, the first cover holder member, and the second cover holder member so that the one hinge member and the first housing are relatively rotatable about the first fulcrum, the one hinge member and the second housing are relatively rotatable about the second fulcrum, and the one hinge member, the first cover holder member, and the second cover holder member are relatively rotatable about the third fulcrum, wherein while the display device is deployed at 180 degrees,
the first fulcrum and the second fulcrum are disposed on a back face side of the display panel, and
the third fulcrum is disposed on a display surface side of the display panel on an opposite side of the back face side.

2. The display device according to claim 1,
wherein, in a plane with an axial direction of the first fulcrum as a normal direction, the first fulcrum, the second fulcrum, and the third fulcrum are disposed to draw an isosceles triangle in which (i) a first side connecting a rotation axis of the first fulcrum and a rotation axis of the third fulcrum and (ii) a second side connecting a rotation axis of the second fulcrum and the rotation axis of the third fulcrum are equal in length.

3. The display device according to claim 1,
wherein, in a plane with an axial direction of the first fulcrum as a normal direction, the first fulcrum, the second fulcrum, and the third fulcrum are disposed to draw a triangle in which a length of a third side connecting a rotation axis of the first fulcrum and a rotation axis of the second fulcrum is twice a distance from a rotation axis of the third fulcrum to a center point of the third side.

4. The display device according to claim 1,
wherein, in a plane with an axial direction of the first fulcrum as a normal direction, the first fulcrum, the second fulcrum, and the third fulcrum are disposed to draw a triangle in which a length of a third side connecting a rotation axis of the first fulcrum and a rotation axis of the second fulcrum is longer than twice a distance from a rotation axis of the third fulcrum to a center point of the third side.

5. The display device according to claim 1,
wherein each of the first cover member and the second cover member includes a first main surface facing the display panel, and a second main surface on an opposite side of the first main surface, and
a rotation axis of the third fulcrum is located on a same plane as the second main surface of the first cover member and located on a same plane as the second main surface of the second cover member in a state in which the housing unit is open to allow the display panel to be open at 180 degrees.

6. The display device according to claim 1, further comprising:
one function film,
wherein the first cover member and the second cover member each include a first main surface facing the display panel, and a second main surface on an opposite side to the first main surface,
the function film includes a first portion bonded to the second main surface of the first cover member, and a second portion bonded to the second main surface of the second cover member, and
the function film overlaps the display region of the display panel in a state in which the housing unit is open to allow the display panel to be open at 180 degrees.

7. The display device according to claim 6,
wherein the rotation axis of the third fulcrum is located on a center surface of the function film in a thickness direction in a state in which the housing unit is open to allow the display panel to be open at 180 degrees.

8. The display device according to claim 5,
wherein each of the first cover member and the second cover member further includes a side surface perpendicular to the second main surface,
the side surface of the first cover member faces the side surface of the second cover member in the state in which the housing unit is open to allow the display panel to be open at 180 degrees, and
the rotation axis of the third fulcrum is located on a same plane as the side surface of the first cover member and located on a same plane as the side surface of the second cover member.

9. The display device according to claim 1,
wherein, in each of the first cover member and the second cover member, a first corner portion, formed between a first main surface facing the display panel and a side surface on a hinge member side, is R-chamfered.

10. The display device according to claim 9,
wherein, in each of the first cover member and the second cover member, a second corner portion formed between the second main surface on the opposite side to the first main surface and the side surface is R-chamfered.

11. The display device according to claim 10,
wherein a radius of a curvature of the R-chamfering of the first corner portion is greater than a radius of a curvature of the R-chamfering of the second corner portion.

12. The display device according to claim 1,
wherein the one hinge member includes:
a first attachment portion connected to a first side portion on one side of the end portion of the first housing and the second housing,
a second attachment portion connected to a second side portion on another side being an opposite side of the one side of the end portion of the first housing and the second housing, and a connecting portion connected between the first attachment portion and the second attachment portion, and having a planar surface facing the display panel, and the display panel abuts on the connecting portion in a state in which the housing unit is folded and closed to allow the display panel to be in a folded state.

13. The display device according to claim 1, wherein the first housing includes a first flange portion, the second end portion of the first cover holder member overlaps the first flange portion in a state in which the housing unit is open to allow the display panel to be open at 180 degrees, the second housing includes a second flange portion, and the second end portion of the second cover holder member overlaps the second flange portion in a state in which the housing unit is open to allow the display panel to be open at 180 degrees.

14. The display device according to claim 13, wherein an end portion of the first cover member overlaps the first flange portion in a state in which the housing unit is open to allow the display panel to be open at 180 degrees, and an end portion of the second cover member overlaps the second flange portion in a state in which the housing unit is open to allow the display panel to be open at 180 degrees.

15. The display device according to claim 1, wherein at least one of the first cover member and the second cover member is slidable with respect to the display panel.

16. The display device according to claim 15, wherein one of the second end portion of the first cover holder member and the first housing is provided with a projection, and the other of the second end portion of the first cover holder member and the first housing is provided with a long hole slidably engaged with the projection.

17. The display device according to claim 16, wherein, in a state in which the housing unit is folded and closed to allow the display panel to be in a folded state, the second end portion of the first cover holder member is located in a position farthest from the rotation axis of the first fulcrum within a slidable range.

18. The display device according to claim 16, wherein, in a state in which the housing unit is open to allow the display panel to be open at 180 degrees, the second end portion of the first cover holder member is located in a position closest to the rotation axis of the first fulcrum within a slidable range.

19. The display device according to claim 1, wherein a first end portion of the display panel is fixed to the first housing, and a second end portion on an opposite side of the first end portion of the display panel is fixed to the second housing.

* * * * *